US012689327B2

(12) United States Patent　(10) Patent No.: US 12,689,327 B2
Singh et al.　(45) Date of Patent: Jul. 21, 2026

(54) METHODS AND APPARATUS TO TERMINATE TRANSMISSION LINES IN VOLTAGE-CONTROLLED OSCILLATORS

(71) Applicant: Texas Instruments Incorporated, Dallas, TX (US)

(72) Inventors: Ritvik Singh, Jodhpur (IN); Arpan Thakkar, Bangalore (IN); Sankaran Aniruddhan, Chennai (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/899,705

(22) Filed: Sep. 27, 2024

(65) Prior Publication Data

US 2026/0095123 A1　Apr. 2, 2026

(51) Int. Cl.
H03B 5/12　(2006.01)

(52) U.S. Cl.
CPC ......... H03B 5/1243 (2013.01); H03B 5/1212 (2013.01); H03B 5/1228 (2013.01); H03B 5/1231 (2013.01)

(58) Field of Classification Search
CPC ................................................... H03B 5/1243
USPC .......................................................... 331/96
See application file for complete search history.

(56) References Cited

U.S. PATENT DOCUMENTS

| | | | | |
|---|---|---|---|---|
| 2008/0309435 A1* | 12/2008 | Wu | ..................... | H03B 5/1253 |
| | | | | 333/204 |
| 2009/0072920 A1* | 3/2009 | Wachi | .................. | H03B 5/1228 |
| | | | | 331/108 R |
| 2012/0223779 A1* | 9/2012 | Lu | ........................ | H03B 5/1243 |
| | | | | 331/56 |
| 2018/0351510 A1* | 12/2018 | Xue | ..................... | H03B 5/1228 |
| 2025/0047240 A1* | 2/2025 | Abdulaziz | ............ | H03B 5/1212 |

OTHER PUBLICATIONS

Andress et al., "Standing Wave Oscillators Utilizing Wave-Adaptive Tapered Transmission Lines," in IEEE Symp. VLSI Circuits Dig. Tech. Papers, Jun. 2004, 4 pages.

* cited by examiner

*Primary Examiner* — Joseph Chang
(74) *Attorney, Agent, or Firm* — Xianghui Huang; Frank D. Cimino

(57)　ABSTRACT
An example apparatus includes: a supply terminal; a first inductor having a first terminal and a second terminal; a second inductor having a first terminal and a second terminal, the first terminal of the second inductor coupled to the supply terminal and the first terminal of the first inductor; a first resistor having a first terminal and a second terminal, the first terminal of the first resistor coupled to the second terminal of the first inductor; a second resistor having a first terminal and a second terminal, the first terminal of the second resistor coupled to the second terminal of the second inductor; a first transmission line having a first terminal and a second terminal, the first terminal of the first transmission line coupled to the second terminal of the first resistor; a second transmission line having a first terminal and a second terminal.

18 Claims, 15 Drawing Sheets

200

Vdd              Vdd

285     BIAS NETWORK     295

225

280               290

250            275

$V_{CNTRL}$ 245            270

215                   220

240            265

235            260

230            255

$F_{OUT}$               $F_{OUT\_180}$ 205            210

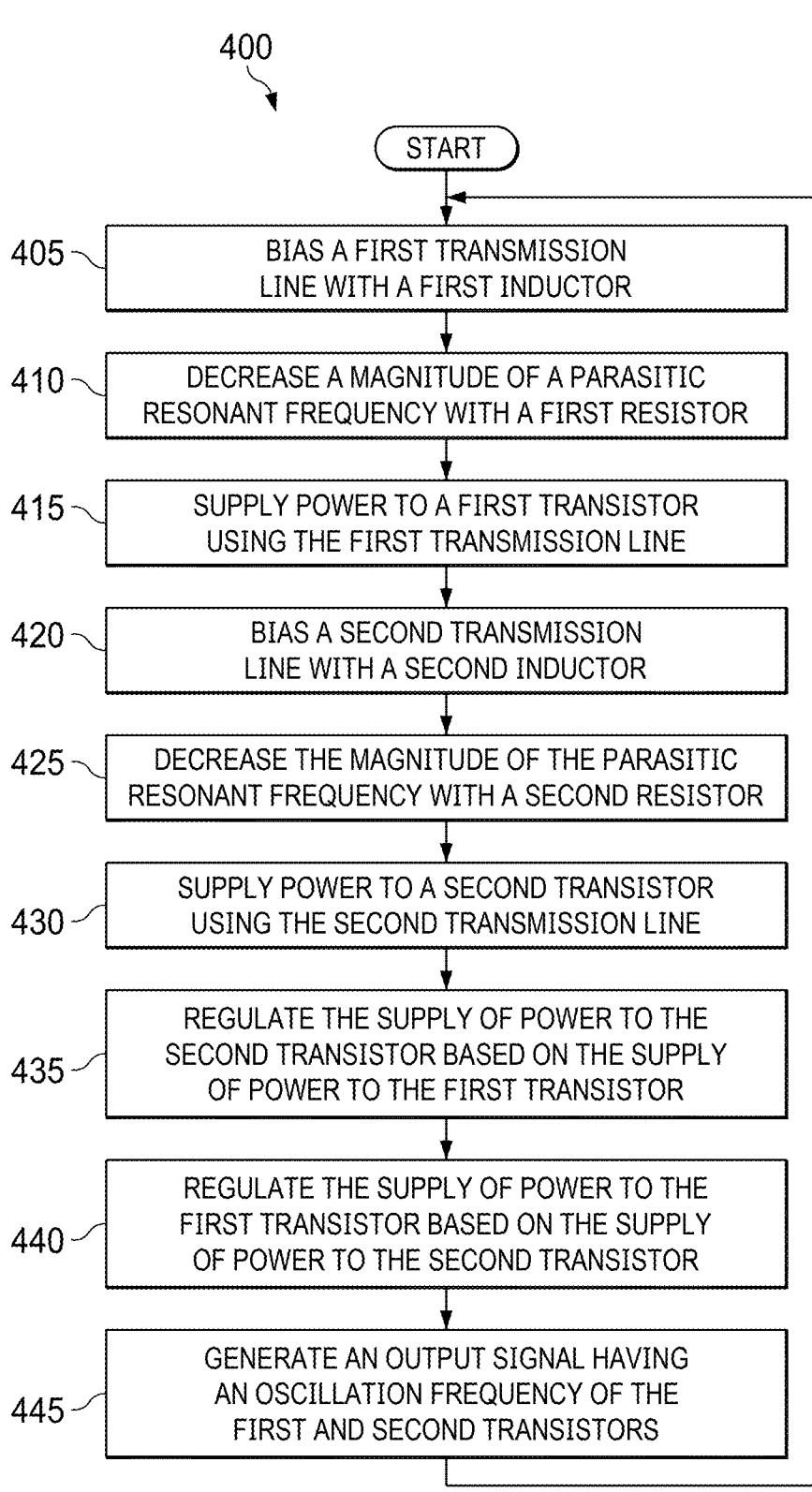

400

START

405 — BIAS A FIRST TRANSMISSION LINE WITH A FIRST INDUCTOR

410 — DECREASE A MAGNITUDE OF A PARASITIC RESONANT FREQUENCY WITH A FIRST RESISTOR

415 — SUPPLY POWER TO A FIRST TRANSISTOR USING THE FIRST TRANSMISSION LINE

420 — BIAS A SECOND TRANSMISSION LINE WITH A SECOND INDUCTOR

425 — DECREASE THE MAGNITUDE OF THE PARASITIC RESONANT FREQUENCY WITH A SECOND RESISTOR

430 — SUPPLY POWER TO A SECOND TRANSISTOR USING THE SECOND TRANSMISSION LINE

435 — REGULATE THE SUPPLY OF POWER TO THE SECOND TRANSISTOR BASED ON THE SUPPLY OF POWER TO THE FIRST TRANSISTOR

440 — REGULATE THE SUPPLY OF POWER TO THE FIRST TRANSISTOR BASED ON THE SUPPLY OF POWER TO THE SECOND TRANSISTOR

445 — GENERATE AN OUTPUT SIGNAL HAVING AN OSCILLATION FREQUENCY OF THE FIRST AND SECOND TRANSISTORS

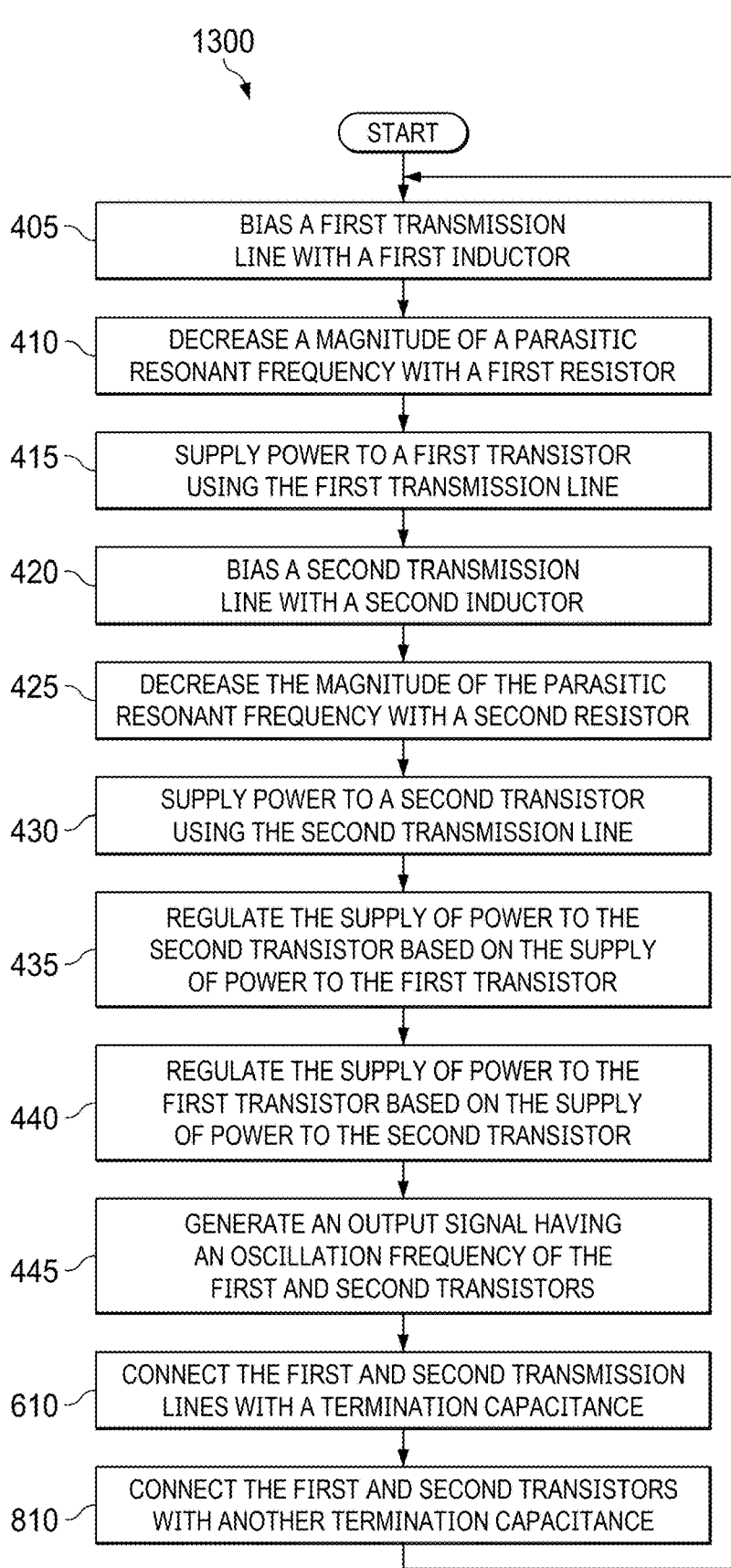

1300

START

405 — BIAS A FIRST TRANSMISSION LINE WITH A FIRST INDUCTOR

410 — DECREASE A MAGNITUDE OF A PARASITIC RESONANT FREQUENCY WITH A FIRST RESISTOR

415 — SUPPLY POWER TO A FIRST TRANSISTOR USING THE FIRST TRANSMISSION LINE

420 — BIAS A SECOND TRANSMISSION LINE WITH A SECOND INDUCTOR

425 — DECREASE THE MAGNITUDE OF THE PARASITIC RESONANT FREQUENCY WITH A SECOND RESISTOR

430 — SUPPLY POWER TO A SECOND TRANSISTOR USING THE SECOND TRANSMISSION LINE

435 — REGULATE THE SUPPLY OF POWER TO THE SECOND TRANSISTOR BASED ON THE SUPPLY OF POWER TO THE FIRST TRANSISTOR

440 — REGULATE THE SUPPLY OF POWER TO THE FIRST TRANSISTOR BASED ON THE SUPPLY OF POWER TO THE SECOND TRANSISTOR

445 — GENERATE AN OUTPUT SIGNAL HAVING AN OSCILLATION FREQUENCY OF THE FIRST AND SECOND TRANSISTORS

610 — CONNECT THE FIRST AND SECOND TRANSMISSION LINES WITH A TERMINATION CAPACITANCE

810 — CONNECT THE FIRST AND SECOND TRANSISTORS WITH ANOTHER TERMINATION CAPACITANCE

FIG. 13

METHODS AND APPARATUS TO TERMINATE TRANSMISSION LINES IN VOLTAGE-CONTROLLED OSCILLATORS

TECHNICAL FIELD

This description relates generally to oscillators and, more particularly, to methods and apparatus to terminate transmission lines in voltage-controlled oscillators.

BACKGROUND

Oscillator circuitry generates clock signal(s) capable of driving circuitry to perform a wide range of possible operations. Digital devices use clock signals for operations such as latching, sampling, etc. Analog devices use clock signals for operations such as signal modulation, synchronized operations, delays, etc. Some oscillator circuitry use standing waves, which propagate along transmission lines, to generate clock signals at an output. Such oscillator circuitry may be referred to as a standing wave oscillator or transmission line oscillator.

SUMMARY

For methods and apparatus to terminate transmission lines in voltage-controlled oscillators, an example apparatus includes a supply terminal; a first inductor having a first terminal and a second terminal; a second inductor having a first terminal and a second terminal, the first terminal of the second inductor coupled to the supply terminal and the first terminal of the first inductor; a first resistor having a first terminal and a second terminal, the first terminal of the first resistor coupled to the second terminal of the first inductor; a second resistor having a first terminal and a second terminal, the first terminal of the second resistor coupled to the second terminal of the second inductor; a first transmission line having a first terminal and a second terminal, the first terminal of the first transmission line coupled to the second terminal of the first resistor; a second transmission line having a first terminal and a second terminal, the first terminal of the second transmission line coupled to the second terminal of the second resistor; a first transistor having a first terminal and a control terminal; and a second transistor having a first terminal and a control terminal, the first terminal of the second transistor coupled to the second terminal of the second transmission line and the control terminal of the first transistor, the control terminal of the second transistor coupled to the second terminal of the first transmission line and the first terminal of the first transistor. Other examples are described.

For methods and apparatus to terminate transmission lines in voltage-controlled oscillators, an example apparatus includes a supply terminal; bias network circuitry having a first terminal, a second terminal, and a third terminal, the first terminal of the bias network circuitry coupled to the supply terminal; a first transmission line having a first terminal and a second terminal; a second transmission line having a first terminal and a second terminal; a capacitor having a first terminal and a second terminal, the first terminal of the capacitor coupled to the second terminal of the bias network circuitry and the first terminal of the first transmission line, the second terminal of the capacitor is coupled to the third terminal of the bias network circuitry and the first terminal of the second transmission line; a first transistor having a first terminal and a control terminal; and a second transistor having a first terminal and a control terminal, the first terminal of the second transistor coupled to the second terminal of the second transmission line and the control terminal of the first transistor, the control terminal of the second transistor coupled to the second terminal of the first transmission line and the first terminal of the first transistor. Other examples are described.

For methods and apparatus to terminate transmission lines in voltage-controlled oscillators, an example apparatus includes a supply terminal; a first inductor coupled to the supply terminal; a second inductor coupled to the supply terminal; a first transmission line coupled to the first inductor, the first transmission line having a first resonant frequency, the first transmission line is configured to generate an output signal having a frequency based on the first resonant frequency; a second transmission line coupled to the second inductor, the second transmission line having a second resonant frequency; a first transistor coupled to the first transmission line and the second transmission line; a second transistor coupled to the first transmission line and the second transmission line, the second transistor is configured to control the first transistor based on the second resonant frequency of the second transmission line; and the first transistor is configured to control the second transistor based on the first resonant frequency of the second transmission line. Other examples are described.

BRIEF DESCRIPTION OF THE DRAWINGS

FIG. 4 is a flowchart representative of example machine-readable instructions or example operations that may be at least one of executed, instantiated, or performed using an example implementation of the voltage-controlled oscillator of FIGS. 1 and 2.

FIG. 13 is a flowchart representative of example machine-readable instructions or example operations that may be at least one of executed, instantiated, or performed using an example implementation of the voltage-controlled oscillator of FIG. 12.

Figure 1:
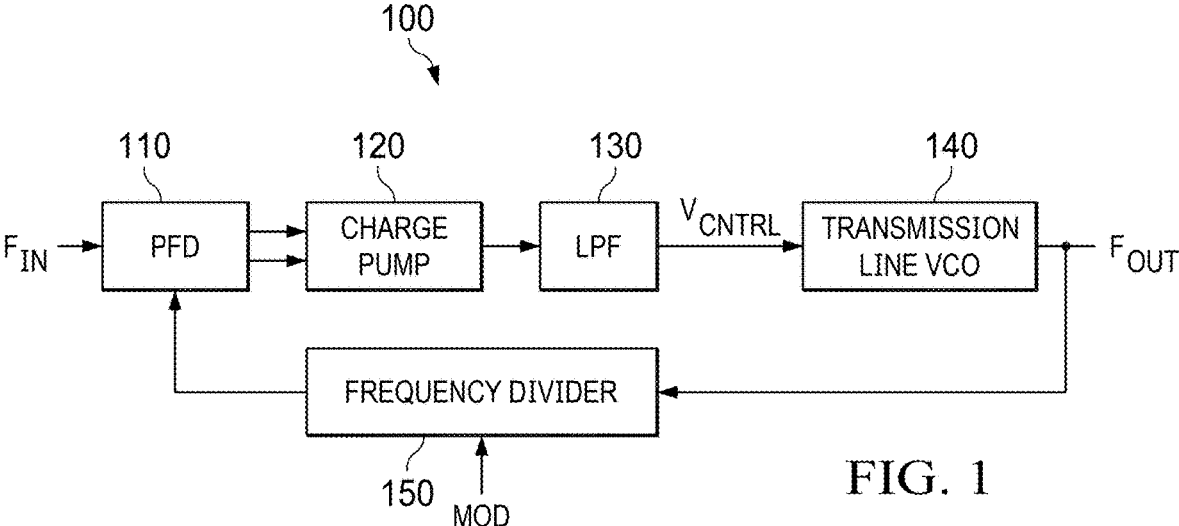
FIG. 1 is a block diagram of an example frequency synthesizer including an example voltage-controlled oscillator.

The drawings are not necessarily to scale. Generally, the same reference numbers in the drawing(s) and this description refer to the same or similar (functionally and/or structurally) features and/or parts. Although the drawings show regions with clean lines and boundaries, some or all of these lines and boundaries may be idealized. In reality, the boundaries or lines may be unobservable, blended or irregular.

DETAILED DESCRIPTION

Oscillator circuitry generates clock signal(s) capable of driving circuitry to perform a wide range of possible operations. Digital devices use clock signals for operations such as latching, sampling, etc. Analog devices use clock signals for operations such as signal modulation, synchronized operations, delays, etc. Some oscillator circuitry use standing waves, which propagate along transmission lines, to generate clock signals at an output. Such oscillator circuitry may be referred to as a standing wave oscillator or transmission line oscillator.

Transmission line oscillators are a type of oscillator circuitry that use a propagation of a standing wave through transmission lines to generate a clock signal. Some transmission line oscillators include a first transmission line, a second transmission, a first transistor, and a second transistor. The first and second transmission lines include inductive and capacitive components that form an inductor-capacitor (LC) tank (also referred to as an LC circuit, LC oscillator, resonator, etc.). The inductive and capacitive components of the first and second transmission lines resonate charge at a frequency that is based on the inductance and capacitance of the transmission lines. Such a frequency may be referred to as a resonant frequency. The first transmission line supplies power to the first transistor, which controls the second transistor. Similarly, the second transmission line supplies power to the second transistor, which controls the first transistor. Such a structure of the first and second transistors may be referred to as cross-coupled.

In a short circuit structure, the first and second transmission lines are coupled together at a supply terminal, which supplies a supply voltage (e.g., Vdd). Such a short circuit terminates the resonating charges of the first and second transmission lines at the supply terminal by biasing the first and second transmission lines. In the short circuit structure, the first and second transmission lines have lengths equal to one of a half or a quarter of a wavelength of a target output frequency. The resonance of charge in the first and second transmission lines produce standing waves responsive to having a length equal to a fraction of the wavelength of the target output frequency. However, to implement the connection of the transmission lines and the supply terminal requires increasing the size of an electrical trace to short circuit the transmission lines. Such an increase in the size of the electrical trace increases parasitic resistances and parasitic inductances between the transmission lines and the supply terminal. The formed parasitic inductances resonant with the capacitive components of the transmission line to create parasitic resonant frequencies and cause deviation in output signal from the target frequency. Some oscillators have begun to use voltage control to compensate (e.g., correct for) deviations in the output signal from the target frequency.

Voltage-controlled oscillators (VCOs) are a type of oscillator circuitry structured to generate an output signal having a frequency that is set responsive to a control voltage. For example, the frequency of the output signal increases responsive to the control voltage increasing. In such examples, the frequency of the output signal decreases responsive to the control voltage decreasing. Transmission line VCOs use the control voltage to bias varactors, which have a capacitance that varies based on a bias voltage. Adjusting the bias of the varactor modifies the resonance frequency of the transmission line to account for the frequency degression resulting from the parasitic inductances. Although implementing the transmission line oscillator as a VCO allows for oscillators to correct frequency degression, parasitics of the short circuit reduce the maximum target frequency, decrease the quality factor, and increase the phase noise of the output signal. As electronics continue to advance, designers are incentivized to use oscillator circuitry capable of producing output signals having a high frequency, high quality factor, and low phase noise.

Examples described herein include methods and apparatus to terminate transmission lines in VCOs using bias network circuitry to increase the quality factor and decrease the phase noise of an output signal. In some described, a VCO includes a first transmission line, a second transmission line, a first transistor, a second transistor, and bias network circuitry. The first transmission line has a first terminal coupled to the bias network circuitry and a second terminal coupled to the first and second transistors. The second transmission line has a first terminal coupled to the bias network circuitry and a second terminal coupled to the first and second transistors. The first transmission line supplies power to the first transistor, which controls the second transistor, and the second transmission line supplies power to the second transistor, which controls the first transistor.

In a short circuit structure, the VCO further includes a capacitor coupled between the first terminal of the first transmission line and the first terminal of the second transmission line. The capacitor is structured to compensate the first and second transmission lines for the parasitic inductance and the parasitic resistance of the short circuit through the capacitor. Advantageously, the capacitor increases the possible output frequencies for a given wavelength by reducing frequency degression from the parasitic inductances. Advantageously, the capacitor increases the quality factor and decreases the phase noise of the output signal by restoring operations of the target wavelength.

In the described examples, the bias network circuitry includes a first resistor, a first inductor, a second resistor, and a second inductor. The first resistor and the first inductor are coupled in series between the first terminal of the first transmission line and the supply terminal. The second resistor and the second inductor are coupled in series between the first terminal of the second transmission line and the supply terminal. The first and second inductors are structured to have inductances large enough to resist the propagation of a resonating charge of the transmission lines. Such a termination using the first and second inductors allows the bias network circuitry to accurately bias the first terminals of the first and second transmission lines to terminate the standing wave of the transmission lines. Advantageously, terminating the resonating charge of the first and second transmission lines increases the quality factor and decreases the phase noise of the output signal. The first and second resistors are structured to create a power loss between the transmission lines and the first and second inductors. Advantageously, the power loss of the first and second resistors reduces the magnitude of a parasitic resonance between the capacitive components of the transmission lines and the first and second inductors. Advantageously, the bias network circuitry improve performance in both short circuit and open circuit VCOs.

FIG. 1 is a block diagram of an example frequency synthesizer 100. In the example of FIG. 1, the frequency synthesizer 100 includes phase frequency detector circuitry 110, a charge pump 120, filter circuitry 130, transmission line VCO 140, and a frequency divider circuitry 150. The frequency synthesizer 100 has a first input, a second input, and an output. The frequency synthesizer 100 is structured to receive an input clock signal having an input frequency (FIN) at the first input. The frequency synthesizer 100 is structured to receive a modulus selection input (MOD) at the second input. The frequency synthesizer 100 is structured to produce an output clock signal having an output frequency (FOUT) at the output of the frequency synthesizer 100.

The phase frequency detector circuitry 110 has a first terminal, a second terminal, a third terminal, and a fourth terminal. The first terminal of the phase frequency detector circuitry 110 is coupled to the first input of the frequency synthesizer 100, which supplies the input clock signal. The second and third terminals of the phase frequency detector is coupled to the charge pump 120. The fourth terminal of the phase frequency detector circuitry 110 is coupled to the frequency divider circuitry 150.

The charge pump 120 has a first terminal, a second terminal, and a third terminal. The first and second terminals of the charge pump circuitry are coupled to the phase frequency detector circuitry 110. The third terminal of the charge pump 120 is coupled to the filter circuitry 130.

The filter circuitry 130 has a first terminal and a second terminal. The first terminal of the filter circuitry 130 is coupled to the charge pump circuitry 120. The second terminal of the filter circuitry 130 is coupled to the transmission line VCO 140.

The transmission line VCO 140 has a first terminal and a second terminal. The first terminal of the transmission line VCO 140 is coupled to the filter circuitry 130. The second terminal of the transmission line VCO 140 is coupled to the frequency divider circuitry 150 and the output of the frequency synthesizer 100, which supplies the output clock signal.

The frequency divider circuitry 150 has a first terminal, a second terminal, and a third terminal. The first terminal of the frequency divider circuitry 150 is coupled to the second input of the frequency synthesizer 100, which supplies the modulus selection input. The second terminal of the frequency divider circuitry 150 is coupled to the transmission line VCO 140 and the output of the frequency synthesizer 100, which supplies the output clock signal.

Figure 2:
FIG. 2 is a schematic diagram of an example of the voltage-controlled oscillator of FIG. 1 including example bias network circuitry to terminate example transmission lines.

FIG. 2 is a schematic diagram of an example voltage-controlled oscillator (VCO) 200, which is an example of the transmission line VCO 140 of FIG. 1. In the example of FIG. 2, the VCO 200 includes a first transistor 205, a second transistor 210, a first transmission line 215, a second transmission line 220, and bias network circuitry 225. The example transmission line 215 of FIG. 2 includes a first example resistor 230, an example inductor 235, a second example resistor 240, a first example capacitor 245, and a second example capacitor 250. The example transmission line 220 of FIG. 2 includes a first example resistor 255, an example inductor 260, a second example resistor 265, a first example capacitor 270, and a second example capacitor 275. The example bias network circuitry 225 of FIG. 2 includes a first example resistor 280, a first example inductor 285, a second example resistor 290, and a second example inductor 295.

The VCO 200 has an input, a first output, and a second output. The input of the VCO 200 is structured to be coupled to the filter circuitry 130, which supplies a control voltage ($V_{CNTRL}$). The VCO 200 is structured to supply a first output clock signal having an output frequency ($F_{OUT}$) at the first output. The VCO 200 is structured to supply a second output clock signal, which is a phase shifted version of the first output clock signal ($F_{OUT\_180}$).

The transistor 205 has a first terminal, a second terminal, and a control terminal. The first terminal of the transistor 205 is coupled to the transistor 210, the transmission line 215, and the first output of the VCO 200. The second terminal of the transistor 205 is coupled to a common terminal, which supplies a common potential (e.g., ground). The control terminal of the transistor 205 is coupled to the transistor 210 and the transmission line 220.

The transistor 210 has a first terminal, a second terminal, and a control terminal. The first terminal of the transistor 210 is coupled to the transistor 205 and the transmission line 220. The second terminal of the transistor 210 is coupled to the common terminal, which supplies the common potential. The control terminal of the transistor 210 is coupled to the transistor 205 and the transmission line 215.

The transmission line 215 has a first terminal, a second terminal, and a third terminal. The first terminal of the transmission line 215 is coupled to the transistors 205, 210. The second terminal of the transmission line 215 is coupled to the bias network circuitry 225. The third terminal of the transmission line 215 is coupled to the transmission line 220 and the input of the VCO 200, which receives the control voltage from the filter circuitry 130.

The transmission line 220 has a first terminal, a second terminal, and a third terminal. The first terminal of the transmission line 220 is coupled to the transistors 205, 210. The second terminal of the transmission line 220 is coupled to the bias network circuitry 225. The third terminal of the transmission line 220 is coupled to the transmission line 215 and the input of the VCO 200, which receives the control voltage from the filter circuitry 130.

The bias network circuitry 225 has a first terminal, a second terminal, and a third terminal. The first terminal of the bias network circuitry 225 is coupled to the transmission line 215. The second terminal of the bias network circuitry 225 is coupled to the transmission line 220. The third terminal of the bias network circuitry 225 is coupled to a supply terminal, which receives a supply voltage (Vdd).

The resistor 230 has a first terminal and a second terminal. The first terminal of the resistor 230 is coupled to the transistors 205, 210. The second terminal of the resistor 230 is coupled to the inductor 235.

The inductor 235 has a first terminal and a second terminal. The first terminal of the inductor 235 is coupled to the resistor 230. The second terminal of the inductor 235 is coupled to the bias network circuitry 225, the resistor 240, and the capacitors 245, 250.

The resistor 240 has a first terminal and a second terminal. The first terminal of the resistor 240 is coupled to the bias network circuitry 225, the inductor 235, and the capacitors 245, 250. The second terminal of the resistor 240 is coupled to the common terminal, which supplies the common potential.

The capacitor 245 has a first terminal and a second terminal. The first terminal of the capacitor 245 is coupled to the bias network circuitry 225, the inductor 235, the resistor 240, and the capacitor 250. The second terminal of the capacitor 245 is coupled to the common terminal, which supplies a common potential.

The capacitor 250 has a first terminal and a second terminal. The first terminal of the capacitor 250 is coupled to the bias network circuitry 225, the inductor 235, the resistor 240, and the capacitor 245. The second terminal of the capacitor 250 is coupled to the transmission line 220 and the input of the VCO 200, which supplies the control voltage. In some examples, the capacitor 250 is referred to as a varactor, which has a capacitance that varies in relation to a bias voltage. In the example of FIG. 2, the control voltage at the input of the VCO 200 controls the capacitance of the capacitor 250.

The resistor 255 has a first terminal and a second terminal. The first terminal of the resistor 255 is coupled to the transistors 205, 210. The second terminal of the resistor 255 is coupled to the inductor 260.

The inductor 260 has a first terminal and a second terminal. The first terminal of the inductor 260 is coupled to the resistor 255. The second terminal of the inductor 260 is coupled to the bias network circuitry 225, the resistor 265, and the capacitors 270, 275.

The resistor 265 has a first terminal and a second terminal. The first terminal of the resistor 265 is coupled to the bias network circuitry 225, the inductor 260, and the capacitors 270, 275. The second terminal of the resistor 265 is coupled to the common terminal, which supplies the common potential.

The capacitor 270 has a first terminal and a second terminal. The first terminal of the capacitor 270 is coupled to the bias network circuitry 225, the inductor 260, the resistor 265, and the capacitor 275. The second terminal of the capacitor 270 is coupled to the common terminal, which supplies a common potential.

The capacitor 275 has a first terminal and a second terminal. The first terminal of the capacitor 270 is coupled to the bias network circuitry 225, the inductor 260, the resistor 265, and the capacitor 270. The second terminal of the capacitor 275 is coupled to the transmission line 215 and the input of the VCO 200, which supplies the control voltage. In some examples, the capacitor 275 is referred to as a varactor, which has a capacitance that varies in relation to a bias voltage. In the example of FIG. 2, the control voltage at the input of the VCO 200 controls the capacitance of the capacitor 275.

The resistor 280 has a first terminal and a second terminal. The first terminal of the resistor 280 is coupled to the transmission line 215. The second terminal of the resistor 280 is coupled to the inductor 285.

The inductor 285 has a first terminal and a second terminal. The first terminal of the inductor 285 is coupled to the resistor 280. The second terminal of the inductor 285 is coupled to a supply terminal, which supplies the supply voltage.

The resistor 290 has a first terminal and a second terminal. The first terminal of the resistor 290 is coupled to the transmission line 220. The second terminal of the resistor 290 is coupled to the inductor 295.

The inductor 295 has a first terminal and a second terminal. The first terminal of the inductor 295 is coupled to the resistor 290. The second terminal of the inductor 295 is coupled to the supply terminal, which supplies the supply voltage.

In the example of FIG. 2, the transistors 205, 210 are NPN bipolar junction transistors (BJTs). Alternatively, the transistors 205, 210 may be n-channel field-effect transistors (FETs), n-channel insulated-gate bipolar transistors (IG-BTs), n-channel junction field effect transistors (JFETs), n-channel metal-oxide semiconductor field-effect transistors (MOSFETs) or, with slight modifications, p-type equivalent devices. Furthermore, the transistors 205, 210 may be implemented in/over a silicon substrate (Si), a silicon carbide substrate (SiC), a gallium nitride substrate (GaN) or a gallium arsenide substrate (GaAs).

Figure 3:
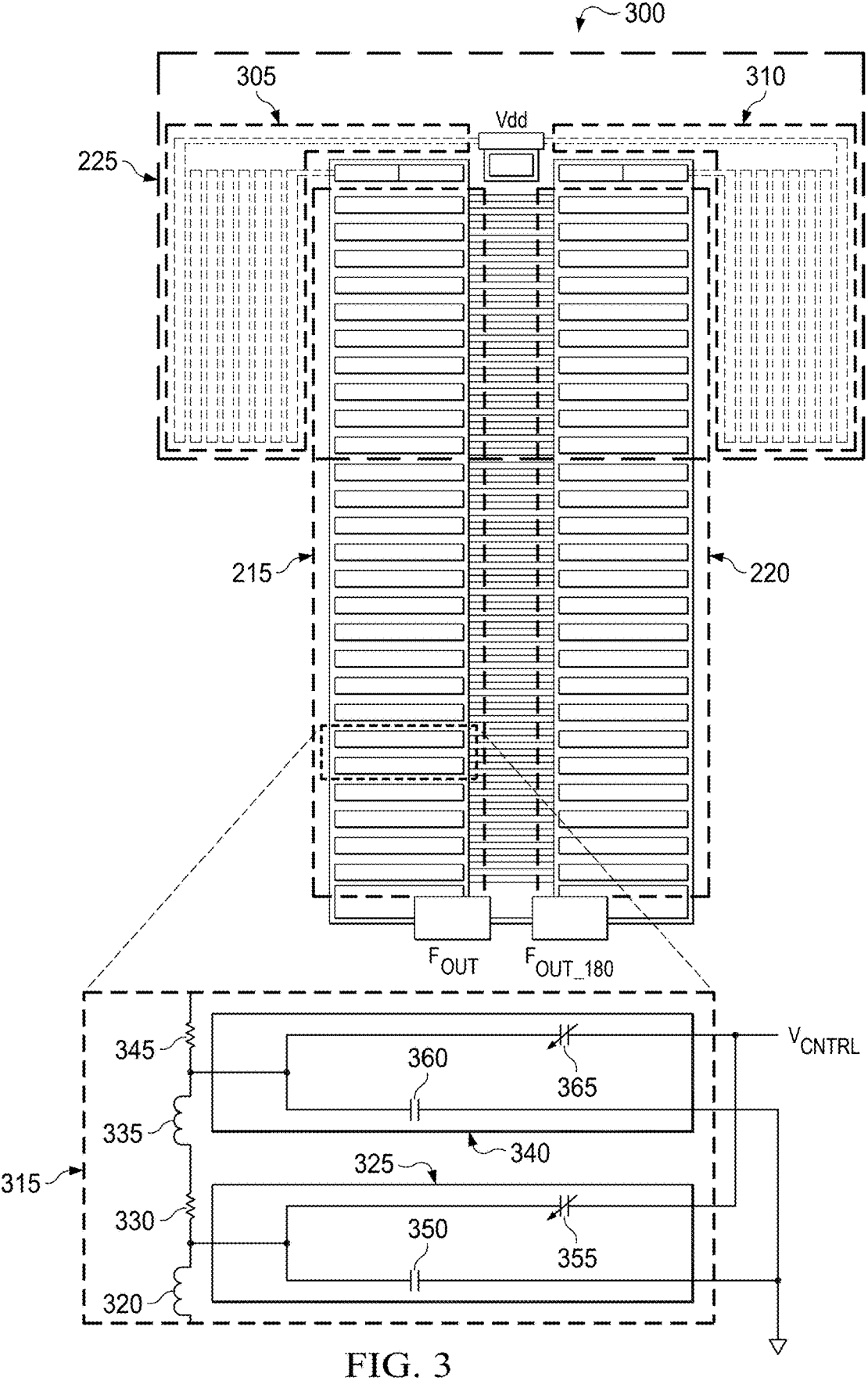
FIG. 3 is a diagram of an example implementation of the bias network circuitry of FIG. 2 and the transmission lines of FIG. 2.

FIG. 3 is a diagram 300 of an example implementation of the transmission lines 215, 220 of FIG. 2 and the bias network circuitry 225 of FIG. 2. The example bias network circuitry 225 of FIG. 3 includes first example electrical traces 305 and second example electrical traces 310. The example transmission line 215 of FIG. 3 includes example equivalent circuitry 315. The example equivalent circuitry 315 of the transmission line 215 further includes a first example inductor 320, first example capacitor circuitry 325, a first example resistor 330, a second example inductor 335, second example capacitor circuitry 340, and a second example resistor 345. The example capacitor circuitry 325 of FIG. 3 includes a first example capacitor 350 and a second example capacitor 355. The example capacitor circuitry 340 of FIG. 3 includes a first example capacitor 360 and a second example capacitor 365.

The transmission line 215 is coupled to the electrical traces 305 or more generally the bias network circuitry 225. The transmission line 220 is coupled to the electrical traces 310 or more generally the bias network circuitry 225. The transmission lines 215, 220 are structured to be coupled to the transistors 205, 210 of FIG. 2. The bias network circuitry 225 is coupled to the transmission lines 215, 220 and the supply terminal, which supplies the supply voltage.

The electrical traces 305 have a first terminal and second terminal. The first terminal of the electrical traces 305 are coupled to the supply terminal, which supplies the supply voltage. The second terminal of the electrical trances 305 are coupled to the transmission line 215. In the example of FIG. 3, the electrical traces 305 form the resistor 280 of FIG. 2 and the inductor 285 of FIG. 2. In some examples, modifying the length of the electrical traces 305 adjusts the resistance of the resistor 280 and modifying the winding (e.g., twisting) of the electrical traces 305 adjusts the inductance of the inductor 285. Advantageously, the electrical traces 305 reduce the package size of the VCO 200 responsive to implementing the resistor 280 and the inductor 285 using the electrical traces 305, which have a relatively small depth.

The electrical traces 310 have a first terminal and second terminal. The first terminal of the electrical traces 310 are coupled to the supply terminal, which supplies the supply voltage. The second terminal of the electrical trances 310 are coupled to the transmission line 220. In the example of FIG.

3, the electrical traces 310 form the resistor 290 of FIG. 2 and the inductor 295 of FIG. 2. In some examples, modifying the length of the electrical traces 310 adjusts the resistance of the resistor 290 and modifying the minding of the electrical traces 310 adjusts the inductance of the inductor 295. Advantageously, the electrical traces 310 reduce the package size of the VCO 200 responsive to implementing the resistor 290 and the inductor 295 using the electrical traces 310, which have a relatively small depth.

The equivalent circuitry 315 is an illustrative representation of equivalent circuitry that forms the transmission line 215. In the example of FIG. 3, the equivalent circuitry 315 illustrates equivalent components of a portion of the transmission line 215. In other examples, one or more instances of the equivalent circuitry 315 are coupled in series to form the transmission line 215. For example, in FIG. 2, the transmission lines 215, 220 illustrate equivalent circuitry for a relatively short transmission line. In such examples, one or more additional instances of the circuitry of the transmission lines 215, 220 may be coupled in series with the transmission lines 215, 220 to support different lengths.

The inductor 320 has a first terminal and a second terminal. The first terminal of the inductor 320 is structured to be coupled to a subsequent portion of the transmission line 215. The second terminal of the inductor 320 is coupled to the capacitor circuitry 325 and the resistor 330. In the example of FIG. 3, the inductor 320 is an equivalent representation of an inductance of a conductive layer supporting the capacitor circuitry 325, 340.

The capacitor circuitry 325 has a first terminal, a second terminal, and a third terminal. The first terminal of the capacitor circuitry 325 is coupled to the inductor 320 and the resistor 330. The second terminal of the capacitor circuitry 325 is coupled to the common terminal, which supplies the common potential. The third terminal of the capacitor circuitry 325 is coupled to the input of the VCO 200, which supplies the control voltage. In some examples, the capacitor circuitry 325 is an equivalent representation of capacitances formed using a series of stacked parallel plates. In the example of FIG. 3, the stack of parallel conductive plates are illustrated by a top view of a top plate of the parallel plates.

The resistor 330 has a first terminal and a second terminal. The first terminal of the resistor 330 is coupled to the inductor 320 and the capacitor circuitry 325. The second terminal of the resistor 330 is coupled to the inductor 335. In the example of FIG. 3, the resistor 330 is an equivalent representation of a resistance of a conductive layer supporting the capacitor circuitry 325, 340. The resistor 330 is an example of the resistor 230 of FIG. 2.

The inductor 335 has a first terminal and a second terminal. The first terminal of the inductor 335 is coupled to the resistor 330. The second terminal of the inductor 335 is coupled to the capacitor circuitry 340 and the resistor 345. In the example of FIG. 3, the inductor 335 is an equivalent representation of an inductance of a conductive layer supporting the capacitor circuitry 325, 340. The inductor 335 is an example of the inductor 235 of FIG. 2.

The capacitor circuitry 340 has a first terminal, a second terminal, and a third terminal. The first terminal of the capacitor circuitry 340 is coupled to the inductor 335 and the resistor 345. The second terminal of the capacitor circuitry 340 is coupled to the common terminal, which supplies the common potential. The third terminal of the capacitor circuitry 340 is coupled to the input of the VCO 200, which supplies the control voltage. In some examples, the capacitor circuitry 340 is an equivalent representation of capacitances formed using a series of stacked parallel plates. In the example of FIG. 3, the stack of parallel conductive plates are illustrated by a top view.

The resistor 345 has a first terminal and a second terminal. The first terminal of the resistor 345 is coupled to the inductor 335 and the capacitor circuitry 340. The second terminal of the resistor 345 320 is structured to be coupled to a subsequent portion of the transmission line 215. In the example of FIG. 3, the resistor 345 is an equivalent representation of a resistance of the conductive layer supporting the capacitor circuitry 325, 340.

The capacitor 350 has a first terminal and a second terminal. The first terminal of the capacitor 350 is coupled to the inductor 320, the resistor 330, and the capacitor 355. The second terminal of the capacitor 350 is coupled to the common terminal, which supplies the common potential. The capacitor 350 is an example of the capacitor 245 of FIG. 2.

The capacitor 355 has a first terminal and a second terminal. The first terminal of the capacitor 355 is coupled to the inductor 320, the resistor 330, and the capacitor 350. The second terminal of the capacitor 355 is coupled to the input of the VCO 200, which supplies the control voltage. The capacitor 355 is an example of the capacitor 250 of FIG. 2. In some examples, the capacitor 355 is referred to as a varactor, which has a capacitance that varies in relation to a bias voltage. In the example of FIG. 3, the control voltage at the input of the VCO 200 controls the capacitance of the capacitor 355.

The capacitor 360 has a first terminal and a second terminal. The first terminal of the capacitor 360 is coupled to the inductor 335, the resistor 345, and the capacitor 365. The second terminal of the capacitor 360 is coupled to the common terminal, which supplies the common potential.

The capacitor 365 has a first terminal and a second terminal. The first terminal of the capacitor 365 is coupled to the inductor 335, the resistor 345, and the capacitor 360. The second terminal of the capacitor 365 is coupled to the input of the VCO 200, which supplies the control voltage. In some examples, the capacitor 365 is referred to as a varactor, which has a capacitance that varies in relation to a bias voltage. In the example of FIG. 3, the control voltage at the input of the VCO 200 controls the capacitance of the capacitor 365.

FIG. 4 is a flowchart representative of example machine-readable instructions or example operations 400 that may be at least one of executed, instantiated, or performed using an example implementation of the VCO 140, 200 of FIGS. 1 and 2. The example operations 400 of FIG. 4 begin at Block 405 at which the inductor 285 of FIG. 2 biases a first transmission line with a first inductance. In some examples, the inductor 285 is an intentional inductance, such as the inductance formed by winding the electrical trace 305 of FIG. 3, coupled in series with the transmission line 215 of FIGS. 2 and 3. In such examples, at a termination location between the transmission line 215 and the bias network circuitry 225, the inductor 285 biases the transmission line 215 with a constant voltage, such as the supply voltage, by preventing the alternating current through the transmission line 215 from further propagating to the supply terminal. In some examples, the inductor 285 is referred to as a choke inductor.

The resistor 280 of FIG. 2 decreases a magnitude of a first resonant frequency with a first resistance. (Block 410). In some examples, the resistor 280 is an intentional resistance, such as the resistance formed by the physical characteristics of the electrical trace 305, coupled in series between the transmission line 215 and the inductor 285. In example operation, the addition of the inductor 285 adds a parasitic resonance frequency responsive to the inductor 285 resonating with the capacitive components of the transmission line 215, such as the capacitors 245, 250, 350, 355, 360, 365 of FIGS. 2 and 3. Advantageously, the resistor 280 introduces a power loss to reduce a magnitude of the parasitic resonance frequency of the inductor 285. Such an example reduction is illustrated and described in further detail in connection with FIG. 14, below.

The resistor 280 and the inductor 285 supply power to a first transistor using the first transmission line. (Block 415). In example operation, the resistor 280 and the inductor 285 supply power to the transistor 205 of FIG. 2 through the transmission line 215. In some examples, such as the examples of FIGS. 2 and 3, the VCO 200 terminates the transmission line 215 using an open-circuit structure. In an open circuit structure, the length of the transmission line 215 is one-half the wavelength ($\lambda$) of a target operating frequency.

Advantageously, the transmission lines 215, 220 support a standing wave VCO, such as the VCO 200, having double the resonant frequency ($f_O$) of the transmission lines 215, 220 in comparison to transmission lines having lengths equal to one-quarter of the wavelength of the target operating frequency. Such reduced length transmission lines are illustrated and described in connection with FIGS. 7, 8, 9, 10, 11, 12, and 13. Advantageously, open circuit structure of the transmission lines 215, 220 increases a quality factor (Q) of the output of the VCO 200 in comparison to a quality factor of with transmission lines equal to one-quarter of the wavelength of the target operating frequency. However, the length of the transmission lines 215, 220 has an attenuation constant ($\alpha$) that is higher than examples with lengths equal to one-half of the wavelength of the target operating frequency, which decreases the quality factor.

The inductor 295 of FIG. 2 biases the second transmission line with a second inductance. (Block 420). In some examples, the inductor 295 is an intentional inductance, such as the inductance formed by winding the electrical trace 310 of FIG. 3, coupled in series with the transmission line 220. In such examples, at a termination location between the transmission line 220 and the bias network circuitry 225, the inductor 295 biases the transmission line 220 with a constant voltage, such as the supply voltage, by preventing the alternating current through the transmission line 220 from further propagating to the supply terminal. In some examples, the inductor 295 is referred to as a choke inductor.

The resistor 290 of FIG. 2 decreases the magnitude of the parasitic resonant frequency with a second resistance. (Block 425). In some examples, the resistor 290 is an intentional resistance, such as the resistance formed by the physical characteristics of the electrical trace 310, coupled in series between the transmission line 220 and the inductor 295. In example operation, the addition of the inductor 295 adds a parasitic resonance frequency responsive to the inductor 295 resonating with the capacitive components of the transmission line 220, such as the capacitors 270, 275 of FIG. 2. Advantageously, the resistor 280 introduces a power loss to reduce a magnitude of the parasitic resonance frequency of the inductor 285. Such an example reduction is illustrated and described in further detail in connection with FIG. 14, below.

The resistor 290 and the inductor 295 supply power to a second transistor using the second transmission line. (Block 430). In example operation, the resistor 290 and the inductor 295 supply power to the transistor 210 of FIG. 2 through the transmission line 220. In some examples, such as the examples of FIGS. 2 and 3, the VCO 200 terminates the transmission line 220 using an open-circuit structure. In an open circuit structure, the length of the transmission line 220 is one-half the wavelength ($\lambda$) of a target operating frequency. Advantageously, setting the length of the transmission lines 215, 220 to one-half the wavelength ($\lambda$) of the target operating frequency improves the quality factor of the output signal in comparison to transmission lines having a quarter wavelength.

The transmission line 215 regulates the supply of power to the second transistor based on the supply of power to the first transistor. (Block 435). In example operations, the inductive components of the transmission line 215, such as the inductors 235, 320, 335 of FIGS. 2 and 3, and the capacitive components of the transmission line 215, such as the capacitors 245, 250, 350, 355, 360, 365, form an inductor-capacitor (LC) tank. The LC tank has a frequency based on the inductance and capacitance of the transmission line 215. In such example operations, control voltage adjusts the resonant frequency of the transmission line 215 by modifying the capacitance of the capacitor 250, which is a voltage dependent varactor. Advantageously, the LC tank generates an alternating current, which the resistor 230 of FIG. 2 converts to a voltage to control the transistor 210.

The transmission line 220 regulates the supply of power to the first transistor based on the supply of power to the second transistor. (Block 440). In example operations, the inductive components of the transmission line 220, such as the inductor 260 of FIG. 2, and the capacitive components of the transmission line 220, such as the capacitors 270, 275, form an inductor-capacitor (LC) tank. The LC tank has a frequency based on the inductance and capacitance of the transmission line 220. In such example operations, control voltage adjusts the resonant frequency of the transmission line 220 by modifying the capacitance of the capacitor 275, which is a voltage dependent varactor. Advantageously, the LC tank generates an alternating current, which the resistor 255 of FIG. 2 converts to a voltage to control the transistor 205.

The transistors 205, 210 generate an output signal having an oscillation frequency. (Block 445). In example operation, the transistor 205 generates a first output clock signal responsive to the LC tank of the transmission line 220 and the transistor 210 generates a second output clock signal responsive to the LC tank of the transmission line 215. In such example operations, the second clock signal is a one-hundred-and-eighty-degree phase shifted version of the first clock signal responsive to the transistors 205 being cross coupled. Advantageously, the bias network circuitry 225 improves the generation of the output signals by the VCO 200, which uses standing waveforms, by using the inductors 285, 295 to supply power to the transmission lines 215, 220 and reduce propagation of alternating currents at the termination of the transmission lines 215, 220. Control proceeds to return to Block 405.

Example methods are described with reference to the flowchart illustrated in FIG. 4. However, many other methods of implementing the VCO 140, 200 of FIGS. 1 and 2 may also be used in this description. For example, the order of execution of the blocks may be changed, or some of the blocks described may be changed, eliminated, or combined. Similarly, additional operations may be included in the manufacturing process before, in between, or after the blocks shown in the illustrated examples.

Figure 5:
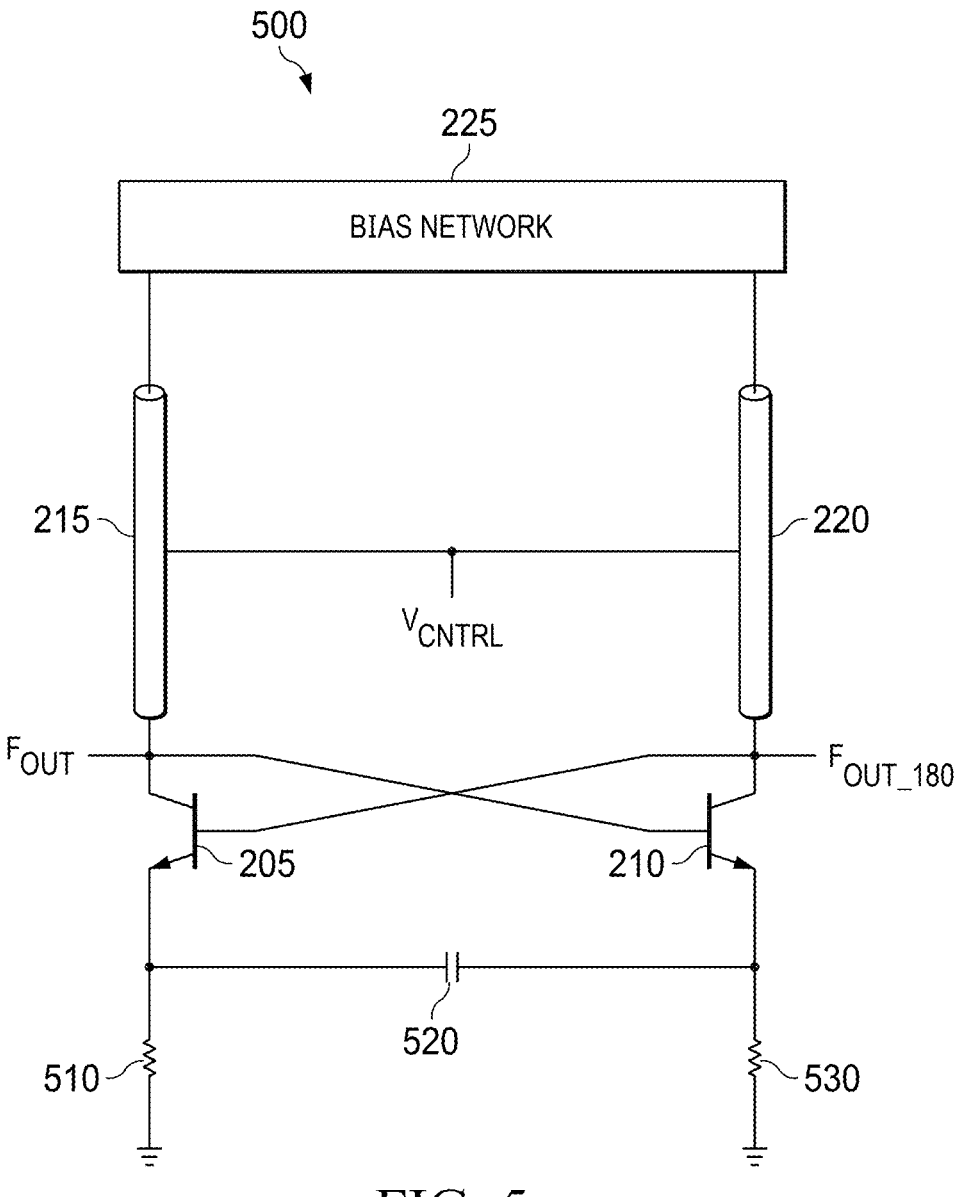
FIG. 5 is a schematic diagram of an example of the voltage-controlled oscillator of FIGS. 1 and 2 further including an example termination capacitor coupled to cross coupled transistors.

FIG. 5 is a schematic diagram of an example VCO 500, which is another example of the VCO 140, 200 of FIGS. 1 and 2. In the example of FIG. 5, the VCO 500 includes the transistors 205, 210 of FIG. 2, the transmission lines 215, 220 of FIGS. 2 and 3, the bias network circuitry 225 of FIGS. 2 and 3, a first resistor 510, a capacitor 520, and a second resistor 530.

The resistor 510 has a first terminal and a second terminal. The first terminal of the resistor 510 is coupled to the transistor 205 and the capacitor 520. The second terminal of the resistor 510 is coupled to the common terminal, which supplies the common potential.

The capacitor 520 has a first terminal and a second terminal. The first terminal of the capacitor 520 is coupled to the transistor 205 and the resistor 510. The second terminal of the capacitor 520 is coupled to the transistor 210 and the resistor 530.

The resistor 530 has a first terminal and a second terminal. The first terminal of the resistor 530 is coupled to the transistor 210 and the capacitor 520. The second terminal of the resistor 530 is coupled to the common terminal, which supplies the common potential.

Figure 6:
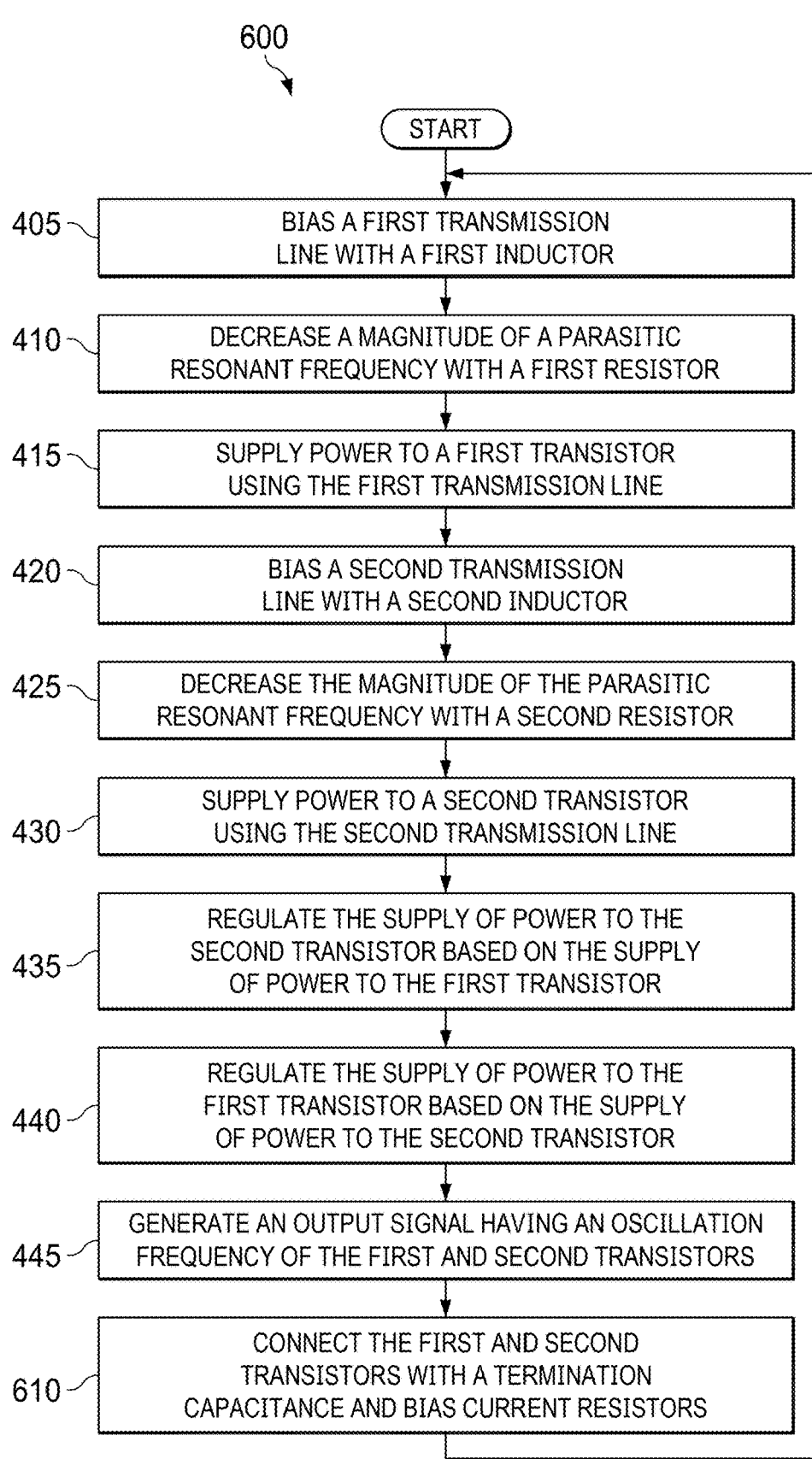
FIG. 6 is a flowchart representative of example machine-readable instructions or example operations that may be at least one of executed, instantiated, or performed using an example implementation of the voltage-controlled oscillator of FIG. 5.

FIG. 6 is a flowchart representative of example machine-readable instructions or example operations 600 that may be at least one of executed, instantiated, or performed using an example implementation of the VCO 500 of FIG. 5. The example operations 600 begin with the operations of Blocks 405, 410, 415, 420, 425, 430, 435, 440, 445 of FIG. 4, above. However, unlike in the example operations 400 of FIG. 4, in the example of FIG. 6, control proceeds to Block 610 at which the resistors 510, 530 of FIG. 5 and the capacitor 520 of FIG. 5 connect the first and second transistors with a termination capacitance and bias current. (Block 610). In some examples, the resistance of the resistors 280, 290 of FIG. 2 are designed to be relatively large values to prevent the parasitic resonance frequency from having a relatively large amplitude across all possible process and temperature conditions. In such examples, increasing the resistance of the resistors 280, 290 increases the power consumption of the VCO 200, 500. However, adding the resistors 510, 530 and the capacitor 520 to filter frequencies less than the target operating frequency allows designers to decrease the resistance of the resistors 280, 290. In example operations, the resistors 510, 530 and the capacitor 520 generate frequency dependent bias currents to reduce the magnitude of the output signals at frequencies less than target resonant frequencies. In such examples, the capacitance of the capacitor 520 is selected such that omega of the parasitic resonance frequency ($\omega_{parasitic}$) is less than the transconductance of the transistor 205, 210 of FIG. 2 ($g_m$) divided by two times the capacitance of the capacitor 520 ($C_T$). Such a capacitance could be found using Equation (1), below.

$$\omega_{parasitic} \ll \frac{g_m}{2C_T} \ll \omega_{target} \qquad \text{Equation (1)}$$

Advantageously, the resistors 510, 530 and the capacitor 520 decrease the power consumption of the VCO 500 by decreasing the size of the resistors 280, 290. Control proceeds to return to Block 405.

Example methods are described with reference to the flowchart illustrated in FIG. 6. However, many other methods of implementing the VCO 500 of FIG. 5 may also be used in this description. For example, the order of execution of the blocks may be changed, or some of the blocks described may be changed, eliminated, or combined. Similarly, additional operations may be included in the manufacturing process before, in between, or after the blocks shown in the illustrated examples.

Figure 7:
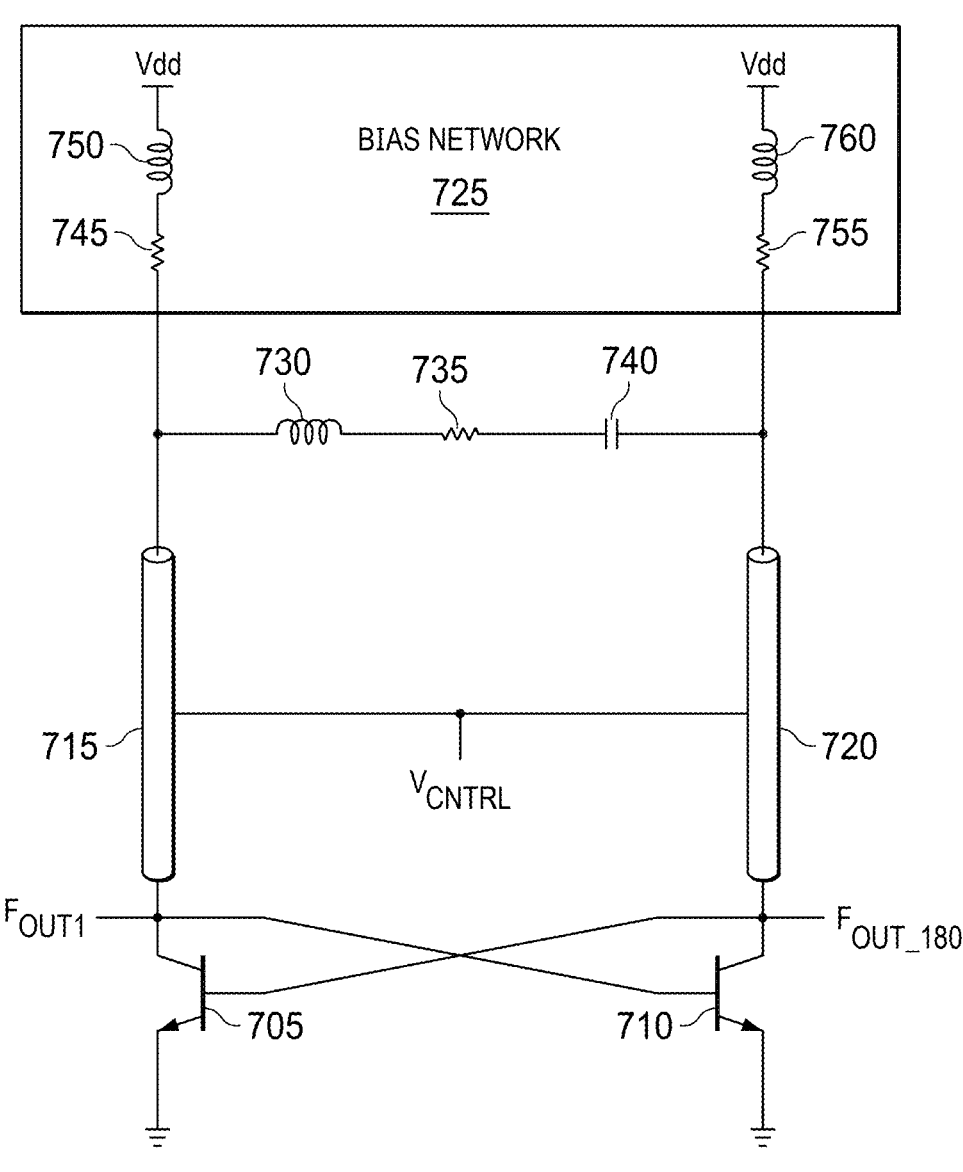
FIG. 7 is a schematic diagram of an example of the voltage-controlled oscillator of FIG. 1 further including an example termination capacitor coupled to example transmission lines.

FIG. 7 is a schematic diagram of an example VCO 700, which is another example of the VCO 140, 200, 500 of FIGS. 1, 2, and 5. In the example of FIG. 7, the VCO 700 includes a first transistor 705, a second transistor 710, a first transmission line 715, a second transmission line 720, bias network circuitry 725, an inductor 730, a resistor 735, and a capacitor 740. The example bias network circuitry 725 of FIG. 7 includes a first example resistor 745, a first example inductor 750, a second example resistor 755, and a second example inductor 760. Unlike the VCOs 200, 500 of FIGS. 2 and 5, the VCO 700 of FIG. 7 uses the inductor 730, the resistor 735, and the capacitor 740 to form a short circuit current path between the transmission lines 715, 720. Advantageously, shorting the transmission lines 715, 720 allows the VCO 700 to use the transmission lines 715, 720 having a length approximately one half the length of the transmission lines 215, 220 of FIGS. 2, 3, and 5. Advantageously, the capacitor 740 may be structured to reduce unintentional effects of the inductor 730 and the resistor 735 that occur responsive to shorting the transmission lines 715, 720.

The VCO 700 has an input, a first output, and a second output. The input of the VCO 700 is structured to be coupled to the filter circuitry 130 of FIG. 1, which supplies a control voltage ($V_{CNTRL}$). The VCO 700 is structured to supply a first output clock signal having an output frequency (FOUT) at the first output. The VCO 700 is structured to supply a second output clock signal, which is a phase shifted version of the first output clock signal ($F_{OUT\_180}$).

The transistor 705 has a first terminal, a second terminal, and a control terminal. The first terminal of the transistor 705 is coupled to the transistor 710, the transmission line 715, and the first output of the VCO 700. The second terminal of the transistor 705 is coupled to a common terminal, which supplies a common potential (e.g., ground). The control terminal of the transistor 705 is coupled to the transistor 710 and the transmission line 720. The transistor 705 is an example of the transistor 205 of FIG. 2.

The transistor 710 has a first terminal, a second terminal, and a control terminal. The first terminal of the transistor 710 is coupled to the transistor 705 and the transmission line 720. The second terminal of the transistor 710 is coupled to the common terminal, which supplies the common potential. The control terminal of the transistor 710 is coupled to the transistor 705 and the transmission line 715. The transistor 710 is an example of the transistor 210 of FIG. 2.

The transmission line 715 has a first terminal, a second terminal, and a third terminal. The first terminal of the transmission line 715 is coupled to the transistors 705, 710. The second terminal of the transmission line 715 is coupled to the bias network circuitry 725 and the transmission line 720 by the inductor 730, the resistor 735, and the capacitor 740. The third terminal of the transmission line 715 is coupled to the transmission line 720 and the input of the VCO 700, which receives the control voltage from the filter circuitry 130. The transmission line 715 is an example of the transmission line 215 of FIG. 2.

The transmission line 720 has a first terminal, a second terminal, and a third terminal. The first terminal of the transmission line 720 is coupled to the transistors 705, 710. The second terminal of the transmission line 720 is coupled to the bias network circuitry 725 and the transmission line 715 by the inductor 730, the resistor 735, and the capacitor 740. The third terminal of the transmission line 720 is coupled to the transmission line 715 and the input of the VCO 700, which receives the control voltage from the filter circuitry 130. The transmission line 720 is an example of the transmission line 220 of FIG. 2.

The bias network circuitry 725 has a first terminal, a second terminal, and a third terminal. The first terminal of the bias network circuitry 725 is coupled to the transmission line 715 and the inductor 730. The second terminal of the bias network circuitry 725 is coupled to the transmission line 720 and the capacitor 740. The third terminal of the bias network circuitry 725 is coupled to a supply terminal, which receives a supply voltage (Vdd). The bias network circuitry 725 is an example of the bias network circuitry 225 of FIG. 2.

The inductor 730 has a first terminal and a second terminal. The first terminal of the inductor 730 is coupled to the transmission line 715 and the bias network circuitry 725. The second terminal of the inductor 730 is coupled to the resistor 735.

The resistor 735 has a first terminal and a second terminal. The first terminal of the resistor 735 is coupled to the inductor 730. The second terminal of the resistor 735 is coupled to the capacitor 740. In the example of FIG. 7, the inductor 730 and the resistor 735 are illustrative representations of equivalent components formed by implementing the VCO 700 with a die. For example, the inductor 730 and the resistor 735 represent the inductance and resistance of a current path connecting the transmission lines 715, 720. In some examples, one or both of the inductor 730 and the resistor 735 may not be illustrated. In such examples, the inductor 730 and the resistor 735 are a characteristic of the connection between the transmission lines 715, 720 by the capacitor 740.

The capacitor 740 has a first terminal and a second terminal. The first terminal of the capacitor 740 is coupled to the resistor 735. The second terminal of the capacitor 740 is coupled to the transmission line 720 and the bias network circuitry 725. In some examples, such as when the inductor 730 and the resistor 735 are not illustrated, the capacitor 740 forms the short circuit current path between the transmission lines 715, 720. In such examples, the inductor 730 and the resistor 735 are considered to be a characteristic of the electrical traces connecting the capacitor 740 to the transmission lines 715, 720.

The resistor 745 has a first terminal and a second terminal. The first terminal of the resistor 745 is coupled to the transmission line 715 and the inductor 730. The second terminal of the resistor 745 is coupled to the inductor 750. The resistor 745 is an example of the resistor 280 of FIG. 2.

The inductor 750 has a first terminal and a second terminal. The first terminal of the inductor 750 is coupled to the resistor 745. The second terminal of the inductor 750 is coupled to the supply terminal, which supplies the supply voltage. The inductor 750 is an example of the inductor 285 of FIG. 2.

The resistor 755 has a first terminal and a second terminal. The first terminal of the resistor 755 is coupled to the transmission line 720 and the capacitor 740. The second terminal of the resistor 755 is coupled to the inductor 760. The resistor 755 is an example of the resistor 290 of FIG. 2.

The inductor 760 has a first terminal and a second terminal. The first terminal of the inductor 760 is coupled to the resistor 755. The second terminal of the inductor 760 is coupled to the supply terminal, which supplies the supply voltage. The inductor 760 is an example of the inductor 295 of FIG. 2.

In the example of FIG. 7, the transistors 705, 710 are NPN BJTs. Alternatively, the transistors 705, 710 may be n-channel FETs, n-channel IGBTs, n-channel JFETs, n-channel MOSFETs or, with slight modifications, p-type equivalent devices. Furthermore, the transistors 705, 710 may be implemented in/over a silicon substrate (Si), a silicon carbide substrate (SiC), a gallium nitride substrate (GaN) or a gallium arsenide substrate (GaAs).

Figure 8:
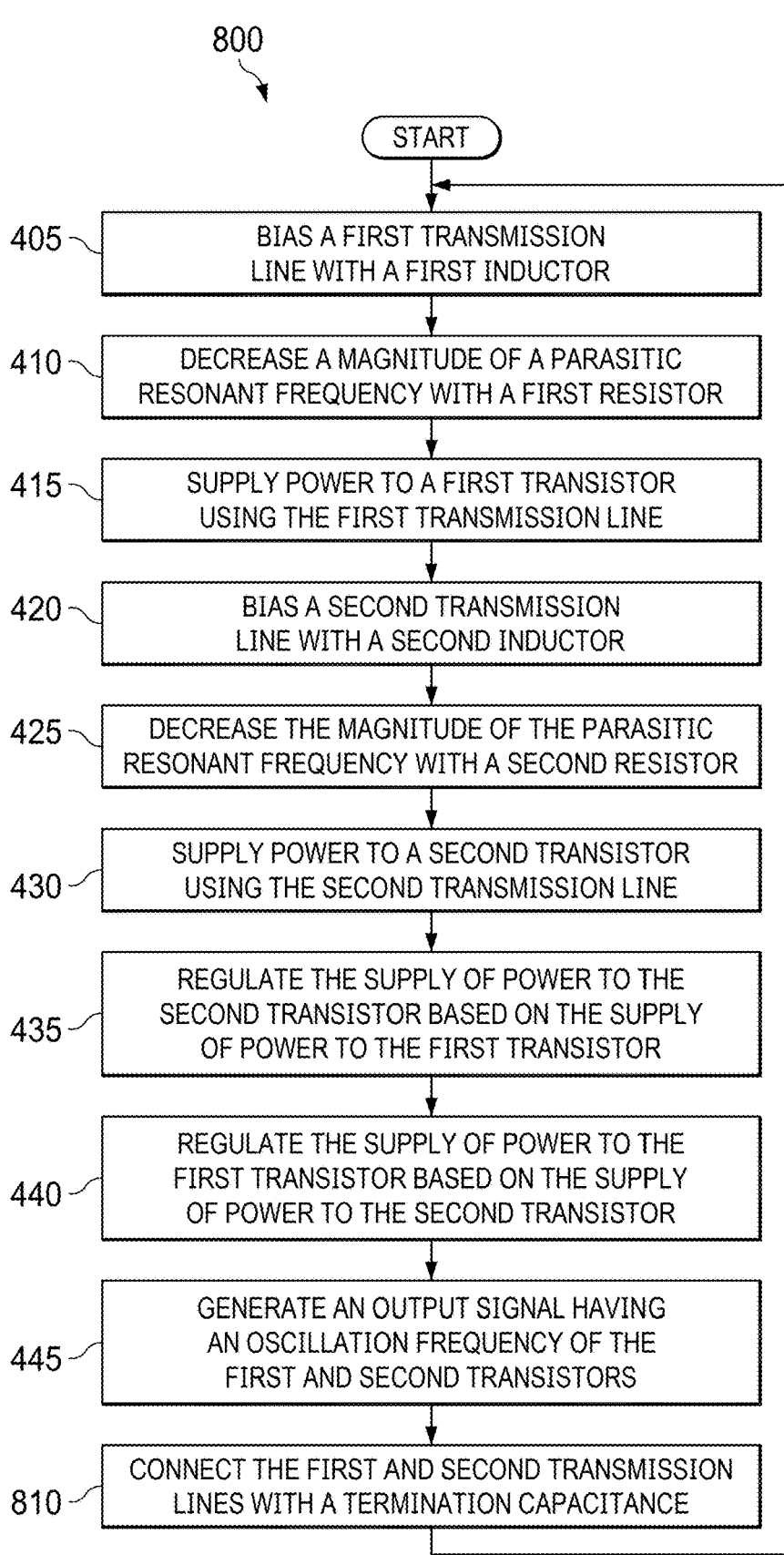
FIG. 8 is a flowchart representative of example machine-readable instructions or example operations that may be at least one of executed, instantiated, or performed using an example implementation of the voltage-controlled oscillator of FIG. 7.

FIG. 8 is a flowchart representative of example machine-readable instructions or example operations 800 that may be at least one of executed, instantiated, or performed using an example implementation of the VCO 700 of FIG. 7. The example operations 800 begin with the operations of Blocks 405, 410, 415, 420, 425, 430, 435, 440, 445 of FIG. 4, above. In the example operations 800 of FIG. 8, the resistors 745, 755 of FIG. 7 and the inductors 750, 760 of FIG. 7 operate interchangeably with the resistors 280, 290 of FIGS. 2 and 5 and the inductors 285, 295 of FIGS. 2 and 5. In the example of FIG. 8, the resistors 745, 755 perform the operations of Blocks 410, 415, 425, 430 in relation to the transmission lines 715, 720 of FIG. 7 and the inductors 750, 760 perform the operations of Blocks 405, 415, 420, 430 in relation to the transmission lines 715, 720. Similarly, the transmission lines 715, 720 perform the operations of Blocks 435, 440 and the transistors 705, 710 of FIG. 7 perform the operations of Block 445.

However, unlike the VCOs 200, 500 of FIGS. 2 and 5, the VCO 700 is structured for short circuit termination of the transmission lines 715, 720. In a short circuit structure, the transmission lines have a length of approximately one-quarter of the wavelength of the desired resonant frequency. Advantageously, decreasing the length of the transmission lines 715, 720 decreases the system-on-chip size of the VCO 700 in comparison to the VCOs 200, 500, which have longer transmission lines 215, 220 of FIGS. 2, 3, and 5.

After Block 445, control proceeds to Block 810 at which the capacitor 740 of FIG. 7 connects the first and second transmission lines with a termination capacitance. In some examples and as further described above, the inductor 730 of FIG. 7 and the resistor 735 of FIG. 7 represent parasitic components arising from shorting the transmission lines 715, 720 using the capacitor 740. Such a termination of the transmission lines 715, 720 using the capacitor 740 may referred to as series resonance termination. In example operation, the capacitance of the capacitor 740 is structured to reduce the series resonance resulting from inductance represented by the inductor 730 and resistor 735. The capacitance of the capacitor 740 ($C_{term}$) is set proportionally to the impact of the inductance of the inductor 730 ($L_{term}$) on the target resonant frequency ($f_O$). Such a capacitance of the capacitor 740 can be determined using Equation (2), below.

$$C_{term} = \frac{1}{\omega_O^2 L_{term}} = \frac{1}{(f_O 2\pi)^2 L_{term}} \qquad \text{Equation (2)}$$

In some examples, the capacitance of the capacitor 740 is further manipulated by intentionally adding at least one of the inductor 730 or the resistor 735. In such examples, intentionally adding a resistance results in an equivalent resistance ($R_{eq}$) that is proportional to the magnitude of the output signal at the resonant frequency ($Z_O$), the attenuation constant ($\alpha$), a length of the current path (l), and the resistance of the resistor 735 ($R_{term}$). Such an equivalent resistance can be determined using Equation (3), below.

$$R_{eq} = \frac{\frac{Z_o}{\alpha l}}{\left(1 + \frac{R_{term}}{Z_o \alpha l}\right)}$$  Equation (3)

In some such examples, adding an intentional inductance ($L_{in}$) that is proportional to the capacitance of the capacitor 740 ($C_{term}$) reduces the complexity of adjusting the quality factor (Q) of the VCO 700. For example, the intentional inductance may be equal to the capacitance of the capacitor 740 times the magnitude of the output signal at the target frequency squared, such as in Equation (4), below. In such examples, the intentional inductance is proportional to the capacitance of the capacitor 740. In example operations, the quality factor proportional to the equivalent resistance, the target resonant frequency, the intentional inductance, and an equivalent inductance ($L_{eq}$).

$$L_{in} = C_{term} Z_o^2$$  Equation (4)

$$Q = \frac{R_{eq}}{\omega_o (L_{in} \| L_{eq})}$$  Equation (5)

Advantageously, decreasing the capacitance of the capacitor 740 and increasing the intentional inductance of the inductor 730 increases the quality factor and improves the phase noise of the VCO 700. Control proceeds to return to Block 405.

Example methods are described with reference to the flowchart illustrated in FIG. 8. However, many other methods of implementing the VCO 700 of FIG. 7 may also be used in this description. For example, the order of execution of the blocks may be changed, or some of the blocks described may be changed, eliminated, or combined. Similarly, additional operations may be included in the manufacturing process before, in between, or after the blocks shown in the illustrated examples.

Figure 9:
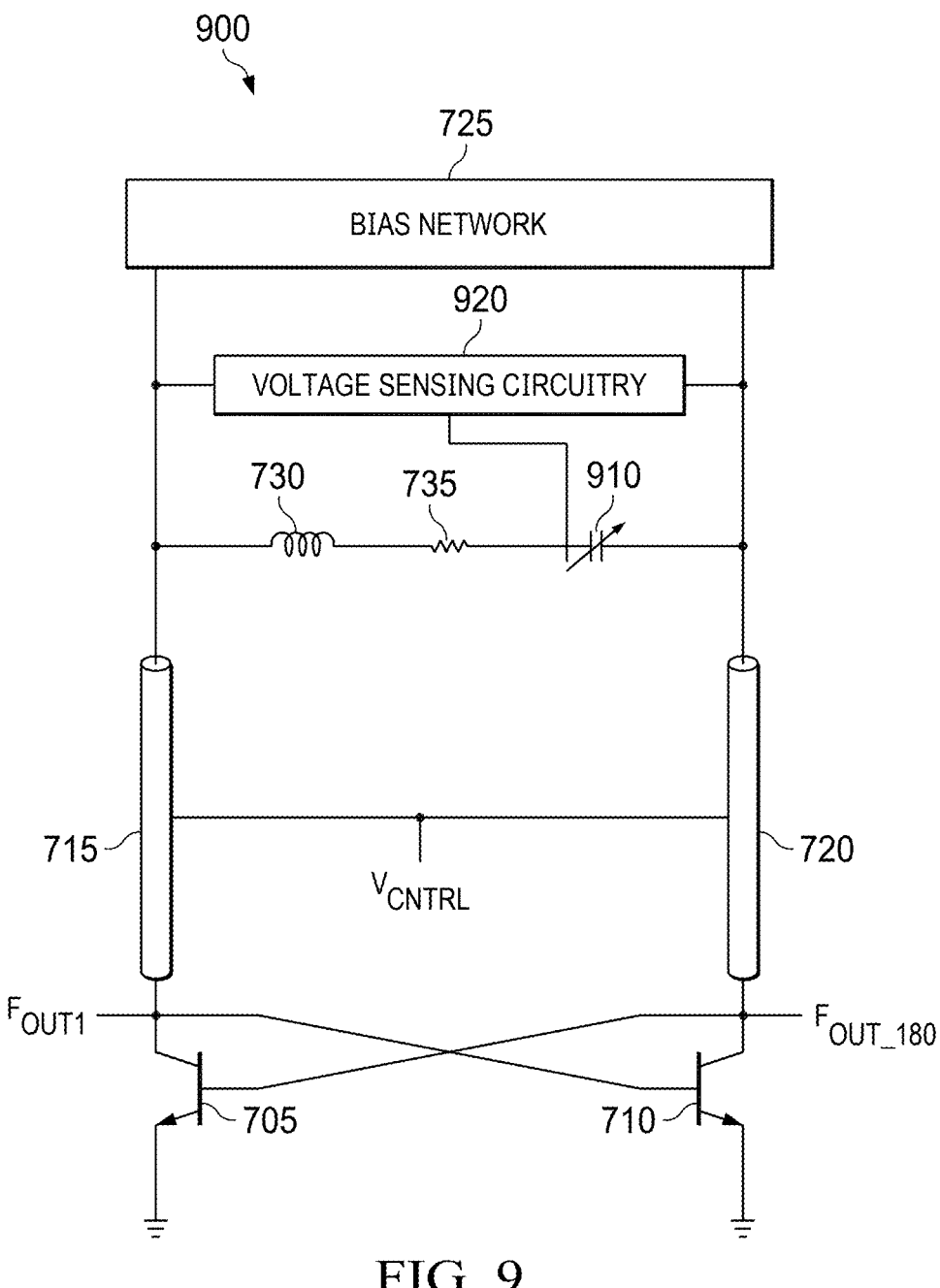
FIG. 9 is a schematic diagram of an example of the voltage-controlled oscillator of FIGS. 1 and 7 further including an example of the termination capacitor of FIG. 7 and example voltage sensing circuitry.

FIG. 9 is a schematic diagram of an example VCO 900, which is another example of the VCO 700 of FIG. 7. In the example of FIG. 9, the VCO 900 includes the transistors 705, 710 of FIG. 7, the transmission lines 715, 720 of FIG. 7, the bias network circuitry 725 of FIG. 7, the inductor 730 of FIG. 7, the resistor 735 of FIG. 7, a capacitor 910, and voltage sensing circuitry 920. Unlike the example of FIG. 7, the VCO 900 dynamically adjusts the capacitance of the capacitor 910 using the voltage sensing circuitry 920. Advantageously, the VCO 900 dynamically corrects the termination capacitance of the capacitor 910 to account for unintentional changes in the VCO 900.

The capacitor 910 has a first terminal, a second terminal, and a control terminal. The first terminal of the capacitor 910 is coupled to the resistor 735. The second terminal of the capacitor 910 is coupled to the transmission line 720, the bias network circuitry 725, and the voltage sensing circuitry 920. The control terminal of the capacitor 910 is coupled to the voltage sensing circuitry 920. In some examples, the capacitor 910 is referred to as a varactor, which has a capacitance that varies in relation to a bias voltage. In the example of FIG. 9, the voltage sensing circuitry 920 controls the capacitance of the capacitor 910 responsive to biasing the capacitor 910.

The voltage sensing circuitry 920 has a first terminal, a second terminal, and a third terminal. The first terminal of the voltage sensing circuitry 920 is coupled to the transmission line 715, the bias network circuitry 725, and the inductor 730. The second terminal of the voltage sensing circuitry 920 is coupled to the transmission line 720, the bias network circuitry 725, and the capacitor 910. The third terminal of the voltage sensing circuitry 920 is coupled to the capacitor 910.

Figure 10:
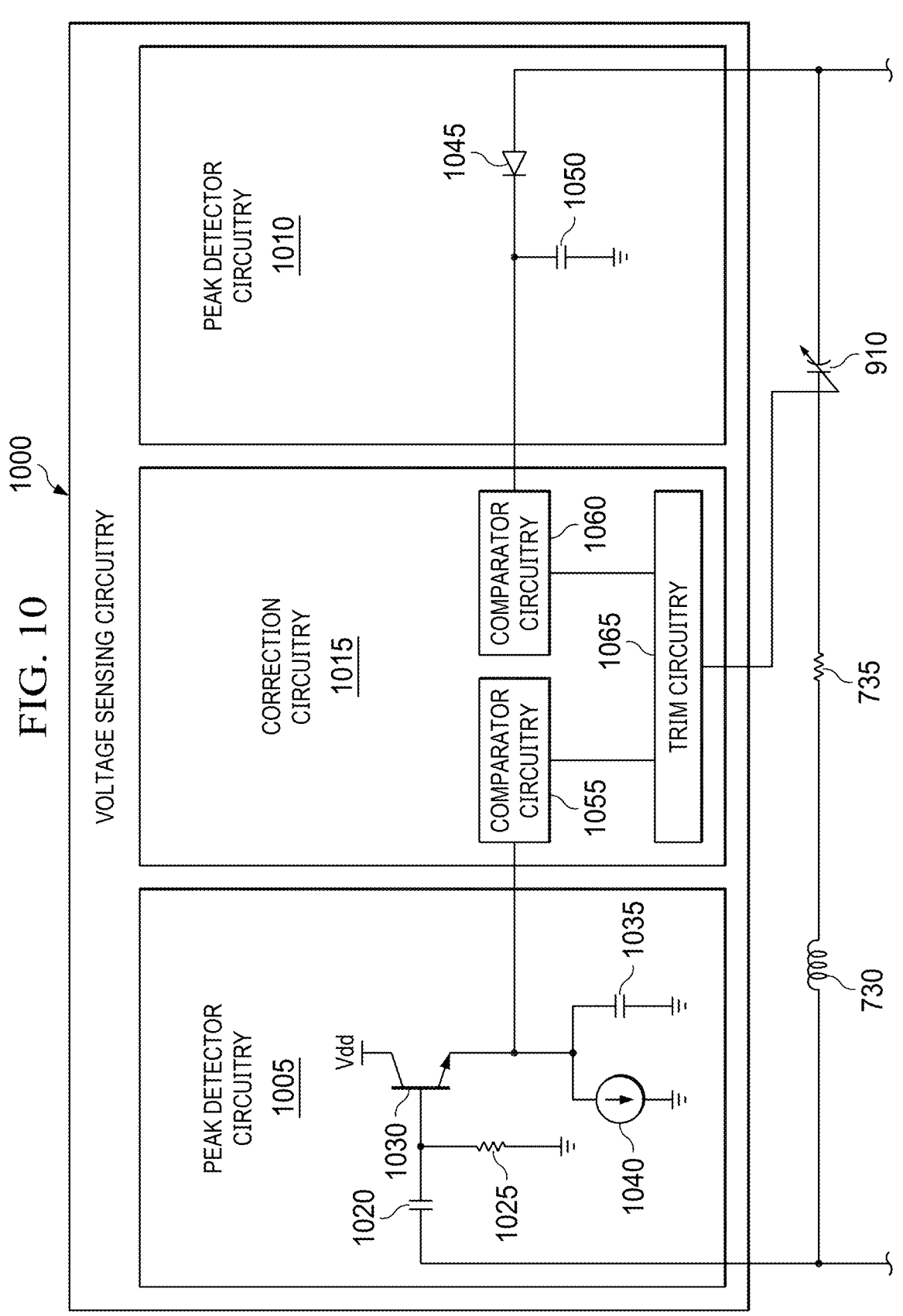
FIG. 10 is a schematic diagram of an example of the voltage sensing circuitry of FIG. 9.

FIG. 10 is a schematic diagram of example voltage sensing circuitry 1000, which is an example of the voltage sensing circuitry 920 of FIG. 9. In the example of FIG. 10, the voltage sensing circuitry 1000 includes first peak detector circuitry 1005, second peak detector circuitry 1010, and correction circuitry 1015. The example peak detector circuitry 1005 of FIG. 10 includes a first example capacitor 1020, a resistor 1025, an example transistor 1030, a second example capacitor 1035, and example current source circuitry 1040. The example peak detector circuitry 1010 of FIG. 10 includes an example diode 1045 and an example capacitor 1050. The example correction circuitry 1015 of FIG. 10 includes first example comparator circuitry 1055, second example comparator circuitry 1060, and example trim circuitry 1065.

The voltage sensing circuitry 1000 has a first input, a second input, and an output. The first input of the voltage sensing circuitry 1000 is structured to be coupled to the transmission line 715 of FIG. 7, the bias network circuitry 725 of FIG. 7, and the inductor 730 of FIG. 7. The second input of the voltage sensing circuitry 1000 is structured to be coupled to the transmission line 720 of FIG. 7, the bias network circuitry 725, and the capacitor 910 of FIG. 9. The output of the voltage sensing circuitry 1000 is coupled to the capacitor 910.

The peak detector circuitry 1005 has a first terminal and a second terminal. The first terminal of the peak detector circuitry 1005 is coupled to the first input of the voltage sensing circuitry 1000. The second terminal of the peak detector circuitry 1005 is coupled to the correction circuitry 1015.

The peak detector circuitry 1010 has a first terminal and a second terminal. The first terminal of the peak detector circuitry 1010 is coupled to the second input of the voltage sensing circuitry 1000. The second terminal of the peak detector circuitry 1010 is coupled to the comparator circuitry 1055. In the example of FIG. 10, the peak detector circuitry 1010 is an alternative example of the peak detector circuitry 1005. Advantageously, the peak detector circuitry 1010 has a lower integration complexity in comparison to the peak detector circuitry 1005.

The correction circuitry 1015 has a first terminal, a second terminal, and a third terminal. The first terminal of the correction circuitry 1015 is coupled to the peak detector circuitry 1005. The second terminal of the correction circuitry 1015 is coupled to the peak detector circuitry 1010. The third terminal of the correction circuitry 1015 is coupled to the capacitor 910.

The capacitor 1020 has a first terminal and a second terminal. The first terminal of the capacitor 1020 is coupled to the first input of the voltage sensing circuitry 1000. The second terminal of the capacitor 1020 is coupled to the resistor 1025 and the transistor 1030.

The resistor 1025 has a first terminal and a second terminal. The first terminal of the resistor 1025 is coupled to the capacitor 1020 and the transistor 1030. The second terminal of the resistor 1025 is coupled to the common terminal, which supplies the common potential.

The transistor 1030 has a first terminal, a second terminal, and a control terminal. The first terminal of the transistor 1030 is coupled to the supply terminal, which supplies the supply voltage. The second terminal of the transistor 1030 is coupled to the correction circuitry 1015, the capacitor 1035, and the current source circuitry 1040. The control terminal of the transistor 1030 is coupled to the capacitor 1020 and the resistor 1025.

The capacitor 1035 has a first terminal and a second terminal. The first terminal of the capacitor 1035 is coupled to the correction circuitry 1015, the transistor 1030, and the current source circuitry 1040. The second terminal of the capacitor 1035 is coupled to the common terminal, which supplies the common potential.

The current source circuitry 1040 has a first terminal and a second terminal. The first terminal of the current source circuitry 1040 is coupled to the correction circuitry 1015, the transistor 1030, and the capacitor 1035. The second terminal of the current source circuitry 1040 is coupled to the common terminal, which supplies the common potential.

The diode 1045 has a first terminal and a second terminal. The first terminal of the diode 1045 is coupled to the second input of the voltage sensing circuitry 1000. The second terminal of the diode 1045 is coupled to the correction circuitry 1015 and the capacitor 1050.

The capacitor 1050 has a first terminal and a second terminal. The first terminal of the capacitor 1050 is coupled to the correction circuitry 1015 and the diode 1045. The second terminal of the capacitor 1050 is coupled to the common terminal, which supplies the common potential.

The comparator circuitry 1055 has a first terminal and a second terminal. The first terminal of the comparator circuitry 1055 is coupled to the transistor 1030, the capacitor 1035, and the current source circuitry 1040. The second terminal of the comparator circuitry 1055 is coupled to the trim circuitry 1065.

The comparator circuitry 1060 has a first terminal and a second terminal. The first terminal of the comparator circuitry 1060 is coupled to the diode 1045 and the capacitor 1050. The second terminal of the comparator circuitry 1060 is coupled to the trim circuitry 1065.

The trim circuitry 1065 has a first terminal, a second terminal, and a third terminal. The first terminal of the trim circuitry 1065 is coupled to the comparator circuitry 1055. The second terminal of the trim circuitry 1065 is coupled to the comparator circuitry 1060.

Figure 11:
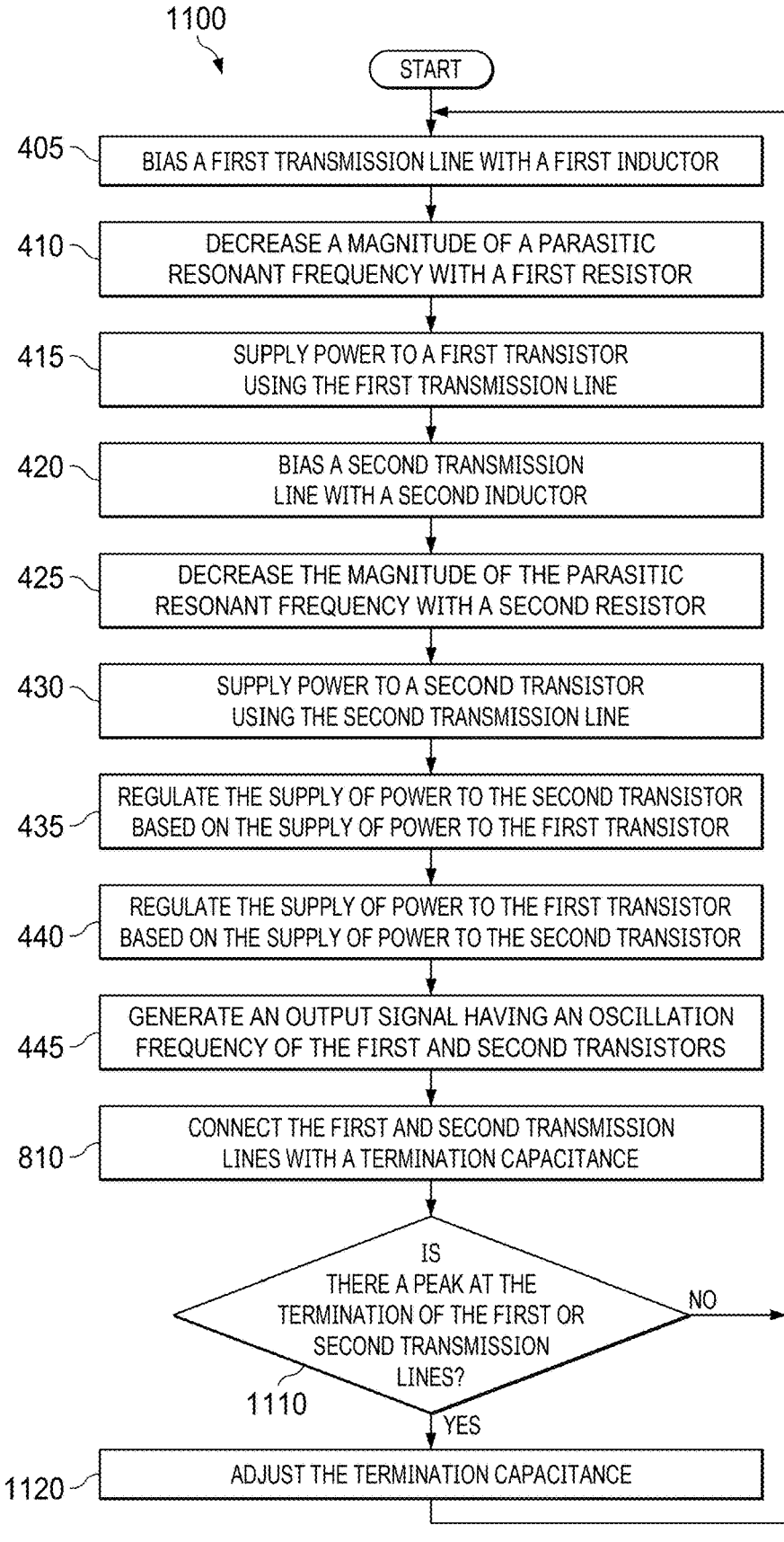
FIG. 11 is a flowchart representative of example machine-readable instructions or example operations that may be at least one of executed, instantiated, or performed using an example implementation of the voltage sensing circuitry of FIGS. 9 and 10 and the voltage-controlled oscillator of FIG. 9.

FIG. 11 is a flowchart representative of example machine-readable instructions or example operations 1100 that may be at least one of executed, instantiated, or performed using an example implementation of the voltage sensing circuitry 920, 1000 of FIGS. 9 and 10, or more generally the VCO 900 of FIG. 9. The example operations 1100 begin with the operations of Blocks 405, 410, 415, 420, 425, 430, 435, 440, 445, 810 of FIGS. 4 and 8, above. In the example operations 1100 of FIG. 11, the resistors 745, 755 of FIG. 7 and the inductors 750, 760 of FIG. 7 operate interchangeably with the resistors 280, 290 of FIGS. 2 and 5 and the inductors 285, 295 of FIGS. 2 and 5. In the example of FIG. 11, the resistors 745, 755 perform the operations of Blocks 410, 415, 425, 430 in relation to the transmission lines 715, 720 of FIGS. 7 and 9 and the inductors 750, 760 perform the operations of Blocks 405, 415, 420, 430 in relation to transmission lines 715, 720. Similarly, the transmission lines 715, 720 perform the operations of Blocks 435, 440 and the transistors 705, 710 of FIGS. 7 and 9 perform the operations of Block 445.

However, unlike the VCOs 200, 500 of FIGS. 2 and 5, the VCOs 700, 900 are structured for short circuit termination of the transmission lines 715, 720. In a short circuit structure, the transmission lines have a length of approximately one-quarter of the wavelength of the desired resonant frequency. Advantageously, decreasing the length of the transmission lines 715, 720 decreases the system-on-chip size of the VCOs 700, 900 in comparison to the VCOs 200, 500, which have longer transmission lines 215, 220 of FIGS. 2, 3, and 5.

After Block 810, control proceeds to Block 1110 at which the voltage sensing circuitry 920, 1000 determines if there is a peak at the termination of the first or second transmission lines. In the example of the peak detector circuitry 1005 of FIG. 10, the capacitor 1020 of FIG. 10 and the resistor 1025 of FIG. 10 filter the voltage at the termination of the transmission line 715 to control the transistor 1030 of FIG. 10. In such an example, the current source circuitry 1040 of FIG. 10 sinks a bias current to set the voltage across the capacitor 1035 of FIG. 10. In the example of the peak detector circuitry 1010 of FIG. 10, the diode 1045 of FIG. 10 rectifies voltages at the termination of the transmission line 720 to set the voltage of the capacitor 1050 of FIG. 10. In such example operations, the capacitor 1050 filters relatively high frequency noise.

If the voltage sensing circuitry 920, 1000 determines that there is not a peak at the termination of the first or second transmission lines (e.g., Block 1110 returns a result of NO), control proceeds to return to Block 405. In the example of the peak detector circuitry 1005, the current source circuitry 1040 pulls down an output of the peak detector circuitry 1005 responsive to a lack of current from the transistor 1030. In the example of the peak detector circuitry 1010, the voltage of the capacitor 1050 remains fixed at the bias voltage set by the bias network circuitry 725 responsive to a lack of a change in current from the diode 1045.

If the voltage sensing circuitry 920, 1000 determines that there is a peak at the termination of either the first or second transmission lines (e.g., Block 1110 returns a result of YES), the voltage sensing circuitry 920, 1000 adjust the termination capacitance. (Block 1120). In the example of the peak detector circuitry 1005, the transistor 1030 begins to conduct current responsive to a variation in the voltage at the termination of the transmission line 715. Such current from the transistor 1030 adjusts the voltage of the capacitor 1035, which sets the output of the peak detector circuitry 1005. In the example of the peak detector circuitry 1010, changes in the voltage at the termination of the transmission line 720, such as a voltage peak, forward bias the diode 1045, which increases the voltage across the capacitor 1050. In such example operations, the comparator circuitry 1055, 1060 of FIG. 10 adjust a trim value of the trim circuitry 1065 of FIG. 10 responsive to sensing the change in outputs of the peak detector circuitry 1005, 1010. In some such examples, the trim circuitry 1065 controls the capacitance of the capacitor 910 of FIGS. 9 and 10 based on the trim value. For example, the trim circuitry 1065 increases the capacitance of the capacitor 910 responsive to the comparator circuitry 1055 increasing the trim value and decreases the capacitance of the capacitor 910 responsive to the comparator decreasing the trim value. Control proceeds to return to Block 405.

Example methods are described with reference to the flowchart illustrated in FIG. 11. However, many other methods of implementing the voltage sensing circuitry 920, 1000 or more generally the VCO 900 of FIG. 9 may also be used in this description. For example, the order of execution of the blocks may be changed, or some of the blocks described may be changed, eliminated, or combined. Similarly, additional operations may be included in the manufacturing process before, in between, or after the blocks shown in the illustrated examples.

Figure 12:
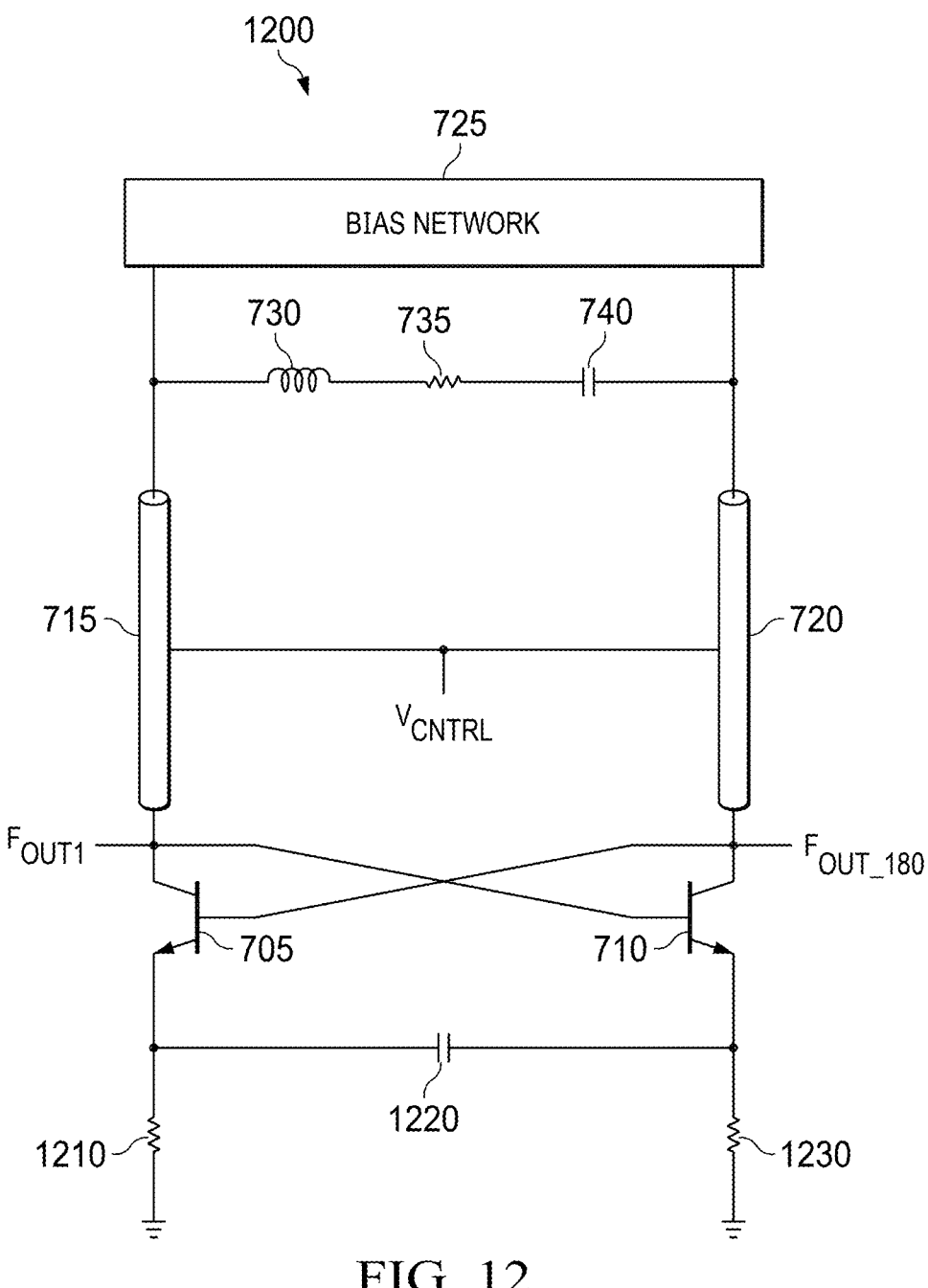
FIG. 12 is a schematic diagram of an example of the voltage-controlled oscillator of FIGS. 7 and 9 further including an example termination capacitor coupled to cross coupled transistors.

FIG. 12 is a schematic diagram of an example VCO 1200, which is another example of the VCO 700, 900 of FIGS. 7 and 9. In the example of FIG. 12, the VCO 1200 includes the transistors 705, 710 of FIGS. 7 and 9, the transmission lines 715, 720 of FIGS. 7 and 9, the bias network circuitry 725 of FIGS. 7 and 9, the inductor 730 of FIGS. 7 and 9, the resistor 735 of FIGS. 7 and 9, the capacitor 740 of FIG. 7, a first resistor 1210, a capacitor 1220, and a second resistor 1230.

The resistor 1210 has a first terminal and a second terminal. The first terminal of the resistor 1210 is coupled to the transistor 705 and the capacitor 1220. The second terminal of the resistor 1210 is coupled to the common terminal, which supplies the common potential.

The capacitor 1220 has a first terminal and a second terminal. The first terminal of the capacitor 1220 is coupled to the transistor 705 and the resistor 1210. The second terminal of the capacitor 1220 is coupled to the transistor 710 and the resistor 1230.

The resistor 1230 has a first terminal and a second terminal. The first terminal of the resistor 1230 is coupled to the transistor 710 and the capacitor 1220. The second terminal of the resistor 1230 is coupled to the common terminal, which supplies the common potential.

FIG. 13 is a flowchart representative of example machine-readable instructions or example operations 1300 that may be at least one of executed, instantiated, or performed using an example implementation of the VCO 1200 of FIG. 12. The example operations 1300 begin with the operations of Blocks 405, 410, 415, 420, 425, 430, 435, 440, 445, 610, 810 of FIGS. 4, 6, and 8, above. In the example operations 1100 of FIG. 11, the resistors 745, 755 of FIG. 7 and the inductors 750, 760 of FIG. 7 operate interchangeably with the resistors 280, 290 of FIGS. 2 and 5 and the inductors 285, 295 of FIGS. 2 and 5. In the example of FIG. 11, the resistors 745, 755 perform the operations of Blocks 410, 415, 425, 430 in relation to the transmission lines 715, 720 of FIGS. 7 and 9 and the inductors 750, 760 perform the operations of Blocks 405, 415, 420, 430 in relation to the transmission lines 715, 720. Similarly, the transmission lines 715, 720 perform the operations of Blocks 435, 440 and the transistors 705, 710 of FIGS. 7 and 9 perform the operations of Block 445. Also, the resistors 1210, 1230 and the capacitor 1220 of FIG. 12 perform the operations of Block 610.

However, unlike the VCOs 200, 500 of FIGS. 2 and 5, the VCOs 700, 900 are structured for short circuit termination of the transmission lines 715, 720. In a short circuit structure, the transmission lines have a length of approximately one-quarter of the wavelength of the desired resonant frequency. Advantageously, decreasing the length of the transmission lines 715, 720 decreases the system-on-chip size of the VCOs 700, 900 in comparison to the VCOs 200, 500, which have longer transmission lines 215, 220 of FIGS. 2, 3, and 5. Control proceeds to return to Block 405.

Example methods are described with reference to the flowchart illustrated in FIG. 13. However, many other methods of implementing the VCO 1200 of FIG. 12 may also be used in this description. For example, the order of execution of the blocks may be changed, or some of the blocks described may be changed, eliminated, or combined. Similarly, additional operations may be included in the manufacturing process before, in between, or after the blocks shown in the illustrated examples.

Figure 14:
FIG. 14 is a plot of an example frequency response of the voltage-controlled oscillator of FIGS. 1, 2, 3, 5, 7, 9, and 12.

FIG. 14 is a plot 1400 of an example frequency response of the VCOs 140, 200, 500, 700, 900, 1200 of FIGS. 1, 2, 5, 7, 9, and 12. In the example of FIG. 14, the plot 1400 includes an example undampened frequency response 1410 and an example dampened frequency response 1420.

The undampened frequency response 1410 represents the magnitude of the output of the VCO 140, 200, 500, 700, 900, 1200 across a range of output frequencies without the resistors 280, 290, 745, 755 of FIGS. 2 and 7 and with the inductors 285, 295, 750, 760 of FIGS. 2 and 7. In example operations, the inductors 285, 295, 750, 760 resonate with the capacitive portions of the transmission lines 215, 220, 715, 720 (e.g. the capacitors 245, 270, 350, 360 of FIGS. 2 and 3) to generate a first example resonance having a first example magnitude 1440 at an undesirable first frequency 1430.

The dampened frequency response 1420 represents the magnitude of the output of the VCO 140, 200, 500, 700, 900, 1200 across a range of output frequencies with the resistors 280, 290, 745, 755 and the inductors 285, 295, 750, 760. In example operations, the resistors 280, 290, 745, 755 create a power loss that reduces the ability of the inductors 285, 295, 750, 760 to resonate with the capacitive portions of the transmission lines 215, 220, 715, 720 (e.g. the capacitors 245, 270, 350, 360). The dampened frequency response 1420 has a first example resonance having a second example magnitude 1450 at the undesirable first frequency 1430.

At a second frequency 1460, which represents the target resonant frequency of the VCO 140, 200, 500, 700, 900, 1200, the undampened frequency response 1410 has a third magnitude 1470 and the dampened frequency response 1420 has a fourth magnitude 1480. In example operation, the VCO corresponding to the undampened frequency response 1410 settles at the first frequency 1430 responsive to the magnitude 1440 being greater than the magnitude 1470. Advantageously, in example operation of the VCOs 140, 200, 500, 700, 900, 1200, which correspond to the dampened frequency response 1420, the output frequency of the clock signal settles at the second frequency 1460 responsive to the magnitude 1450 being less than the magnitude 1480.

At a third frequency 1490, which represents a frequency greater than the target frequency at the second frequency 1460, the undampened frequency response 1410 and the dampened frequency response 1420 have magnitudes less than the magnitudes 1470, 1480. Also, at resonant frequencies greater than the third frequency 1490, the magnitudes of the undampened frequency response 1410 and the dampened frequency response 1420 continue to decrease. Advantageously, power consumption by the resistors 280, 290, 745, 755 reduces the magnitude of the clock signal at resonant frequency less than the target resonant frequency.

Figure 15:
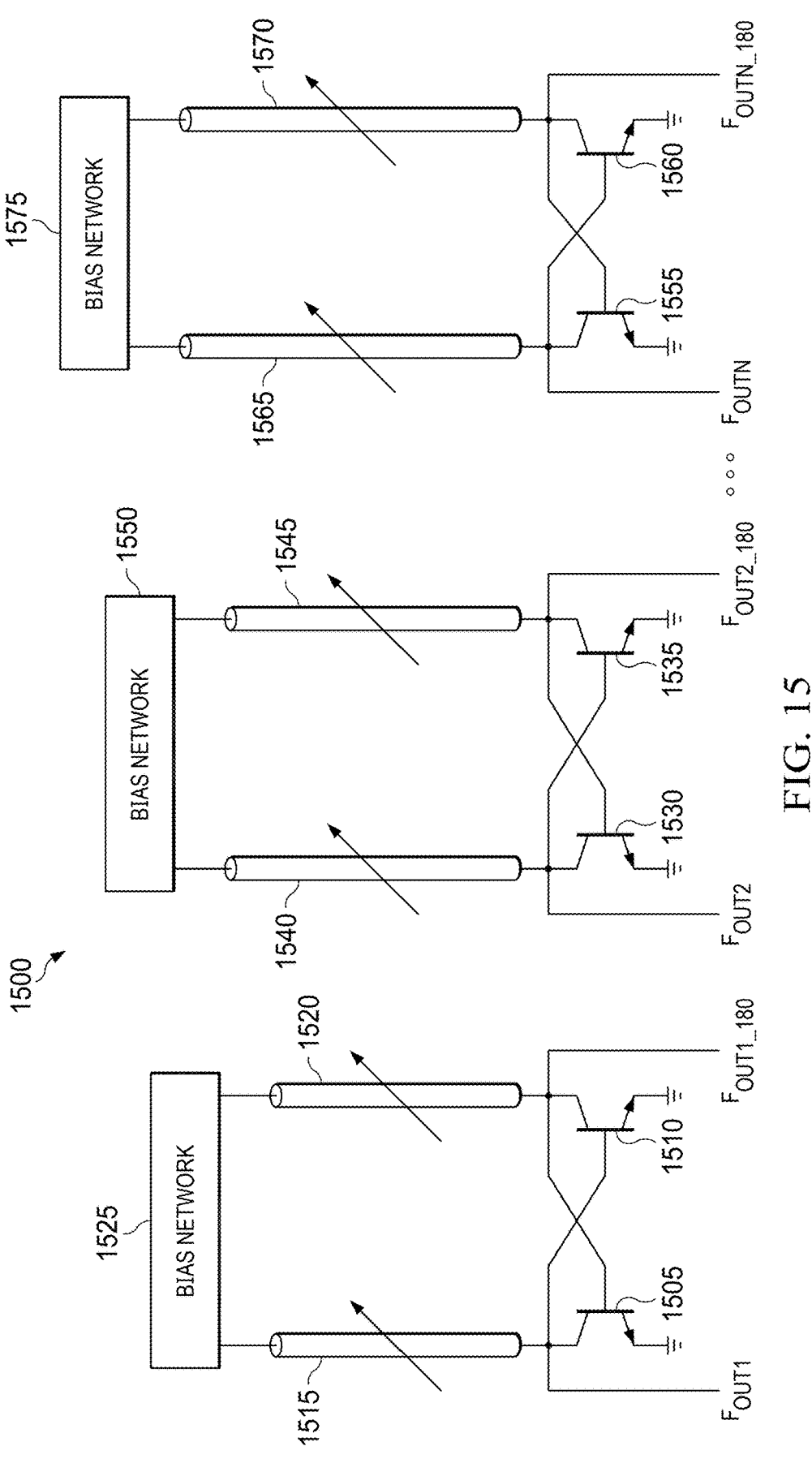
FIG. 15 is a schematic diagram of an example multi-frequency voltage-controlled oscillator.

FIG. 15 is a schematic diagram of an example multi-frequency VCO 1500. In the example of FIG. 15, the multi-frequency VCO 1500 includes a first transistor 1505, a second transistor 1510, a first transmission line 1515, a second transmission line 1520, a first bias network 1525, a third transistor 1530, a fourth transistor 1535, a third transmission line 1540, a fourth transmission line 1545, a second bias network 1550, a fifth transistor 1555, a sixth transistor 1560, a fifth transmission line 1565, a sixth transmission line 1570, and a third bias network 1575.

The transistors 1505, 1510, the transmission lines 1515, 1520, and the bias network 1525 form a first VCO having a first output frequency ($F_{OUT1}$, $F_{OUT1\_180}$). The transistors 1530, 1535, the transmission lines 1540, 1545, and the bias network 1550 form a second VCO having a second output frequency ($F_{OUT2}$, $F_{OUT2\_180}$). The transistors 1555, 1560, the transmission lines 1565, 1570, and the bias network 1575 form a third VCO having a third output frequency ($F_{OUTN}$, $F_{OUTN\_180}$). The different output frequencies of the multi-frequency VCO 1500 is responsive to each set of the transmission lines 1515, 1520, 1540, 1545, 1565, 1570 having different lengths. In such examples, the different lengths of the transmission lines 1515, 1520, 1540, 1545, 1565, 1570 correspond to the different wavelengths of varying target frequencies. In some examples, the multi-frequency VCO 1500 further includes multiplexer circuitry to select one or more of the output signals from one or more of the transistors 1505, 1510, 1530, 1535, 1555, 1560. Alternatively, the multi-frequency VCO 1500 may implement different lengths of the transmission lines 1515, 1520, 1540, 1545, 1565, 1570 using a series of switches structured to coupled one or more portions of a transmission line to another (e.g., the equivalent circuitry 315 of FIG. 3). Advantageously, including multiple instances of the VCOs described herein in a single package increases the number of possible output frequencies of the transmission line VCO 140 of FIG. 1.

In the example of FIG. 15, the transistors 1505, 1510, 1530, 1535, 1555, 1560 are NPN BJTs. Alternatively, the transistors 1505, 1510, 1530, 1535, 1555, 1560 may be n-channel FETs, n-channel IGBTs, n-channel JFETs, n-channel MOSFETs or, with slight modifications, p-type equivalent devices. Furthermore, the transistors 1505, 1510, 1530, 1535, 1555, 1560 may be implemented in/over a silicon substrate (Si), a silicon carbide substrate (SiC), a gallium nitride substrate (GaN) or a gallium arsenide substrate (GaAs).

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, additional elements, terms, etc., may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, or (7) A with B and with C. As used herein in the context of describing structures, components, items, objects and things, the phrase "at least one of A and B" refers to implementations including any of (1) at least one A, (2) at least one B, or (3) at least one A and at least one B. Similarly, as used herein in the context of describing structures, components, items, objects and things, the phrase "at least one of A or B" refers to implementations including any of (1) at least one A, (2) at least one B, or (3) at least one A and at least one B. As used herein in the context of describing the performance or execution of processes, instructions, actions, activities, etc., the phrase "at least one of A and B" refers to implementations including any of (1) at least one A, (2) at least one B, or (3) at least one A and at least one B. Similarly, as used herein in the context of describing the performance or execution of processes, instructions, actions, activities, etc., the phrase "at least one of A or B" refers to implementations including any of (1) at least one A, (2) at least one B, or (3) at least one A and at least one B.

As used herein, singular references (e.g., "a," "an," "first," "second," etc.) do not exclude a plurality. The term "a" or "an" object, as used herein, refers to one or more of that object. The terms "a" (or "an"), "one or more," and "at least one" are used interchangeably herein. Furthermore, although individually listed, a plurality of means, elements, or actions may be implemented by, e.g., the same entity or object. Also, although individual features may be included in different examples or claims, these may possibly be combined, and the inclusion in different examples or claims does not imply that a combination of features is at least one of not feasible or advantageous.

As used herein, unless otherwise stated, the term "above" describes the relationship of two parts relative to Earth. A first part is above a second part, if the second part has at least one part between Earth and the first part. Likewise, as used herein, a first part is "below" a second part when the first part is closer to the Earth than the second part. As noted above, a first part can be above or below a second part with one or more of: other parts therebetween, without other parts therebetween, with the first and second parts touching, or without the first and second parts being in direct contact with one another.

As used in this patent, stating that any part (e.g., a layer, film, area, region, or plate) is in any way on (e.g., positioned on, located on, disposed on, or formed on, etc.) another part, indicates that the referenced part is either in contact with the other part, or that the referenced part is above the other part with one or more intermediate part(s) located therebetween.

As used herein, connection references (e.g., attached, coupled, connected, and joined) may include intermediate members between the elements referenced by at least one of the connection reference or relative movement between those elements unless otherwise indicated. As such, connection references do not necessarily infer that two elements are directly connected or in fixed relation to each other. As used herein, stating that any part is in "contact" with another part is defined to mean that there is no intermediate part between the two parts.

Unless specifically stated otherwise, descriptors such as "first," "second," "third," etc., are used herein without imputing or otherwise indicating any meaning of priority, physical order, arrangement in a list, or ordering in any way, but are merely used as at least one of labels or arbitrary names to distinguish elements for ease of understanding the described examples. In some examples, the descriptor "first" may be used to refer to an element in the detailed description, while the same element may be referred to in a claim with a different descriptor such as "second" or "third." In such instances, such descriptors are used merely for identifying those elements distinctly within the context of the discussion (e.g., within a claim) in which the elements might, for example, otherwise share a same name.

As used herein, "approximately" and "about" modify their subjects/values to recognize the potential presence of variations that occur in real world applications. For example, "approximately" and "about" may modify dimensions that may not be exact due to at least one of manufacturing tolerances or other real-world imperfections. For example, "approximately" and "about" may indicate such dimensions may be within a tolerance range of $+/-10\%$ unless otherwise specified herein.

As used herein, the phrase "in communication," including variations thereof, encompasses one of or a combination of direct communication or indirect communication through one or more intermediary components, and does not require direct physical (e.g., wired) communication or constant communication, but rather also includes selective communication at least one of periodic intervals, scheduled intervals, aperiodic intervals, or one-time events.

As used herein, "programmable circuitry" is defined to include at least one of (i) one or more special purpose electrical circuits (e.g., an application specific circuit (ASIC)) structured to perform specific operation(s) and including one or more semiconductor-based logic devices (e.g., electrical hardware implemented by one or more transistors), or (ii) one or more general purpose semiconductor-based electrical circuits programmable with instructions to perform one or more specific functions(s) or operation(s) and including one or more semiconductor-based logic devices (e.g., electrical hardware implemented by one or more transistors). Examples of programmable circuitry include programmable microprocessors such as Central Processor Units (CPUs) that may execute first instructions to perform one or more operations or functions, Field Programmable Gate Arrays (FPGAs) that may be programmed with second instructions to at least one of configure or structure the FPGAs to instantiate one or more operations or functions corresponding to the first instructions, Graphics Processor Units (GPUs) that may execute first instructions to perform one or more operations or functions, Digital Signal Processors (DSPs) that may execute first instructions to perform one or more operations or functions, XPUs, Network Processing Units (NPUs) one or more microcontrollers that may execute first instructions to perform one or more operations or functions or integrated circuits such as Application Specific Integrated Circuits (ASICs). For example, an XPU may be implemented by a heterogeneous computing system including multiple types of programmable circuitry (e.g., one or more FPGAs, one or more CPUs, one or more GPUs, one or more NPUs, one or more DSPs, etc., and any combination(s) thereof), and orchestration technology (e.g., application programming interface(s) (API(s)) that may assign computing task(s) to whichever one(s) of the multiple types of programmable circuitry is/are suited and available to perform the computing task(s).

As used herein integrated circuit/circuitry is defined as one or more semiconductor packages containing one or more circuit elements such as transistors, capacitors, inductors, resistors, current paths, diodes, etc. For example an integrated circuit may be implemented as one or more of an ASIC, an FPGA, a chip, a microchip, programmable circuitry, a semiconductor substrate coupling multiple circuit elements, a system on chip (SoC), etc.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., at least one of programmed or hardwired) at a time of manufacturing by a manufacturer to at least one of perform the function or be configurable (or re-configurable) by a user after manufacturing to perform the function/or other additional or alternative functions. The configuring may be through at least one of firmware or software programming of the device, through at least one of a construction or layout of hardware components and interconnections of the device, or a combination thereof.

As used herein, the terms "terminal," "node," "interconnection," "pin" and "lead" are used interchangeably. Unless specifically stated to the contrary, these terms are generally used to mean an interconnection between or a terminus of a device element, a circuit element, an integrated circuit, a device or other electronics or semiconductor component.

In the description and claims, described "circuitry" may include one or more circuits. A circuit or device that is described herein as including certain components may instead be adapted to be coupled to those components to form the described circuitry or device. For example, a structure described as including one or more semiconductor elements (such as transistors), one or more passive elements (such as one of or a combination of resistors, capacitors, or inductors), or one or more sources (such as voltage and/or current sources) may instead include only the semiconductor elements within a single physical device (e.g., at least one of a semiconductor die or integrated circuit (IC) package) and may be adapted to be coupled to at least some of the passive elements or the sources to form the described structure either at a time of manufacture or after a time of manufacture, for example, by at least one of an end-user or a third-party.

Circuits described herein are reconfigurable to include the replaced components to provide functionality at least partially similar to functionality available prior to the component replacement. Components shown as resistors, unless otherwise stated, are generally representative of any one or more elements coupled in at least one of series or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor. While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and some features illustrated as being internal to the integrated circuit may be incorporated outside of the integrated. As used herein, the term "integrated circuit" means one or more circuits that are at least one of: (i) incorporated in/over a semiconductor substrate; (ii) incorporated in a single semiconductor package; (iii) incorporated into the same module; or (iv) incorporated in/on the same printed circuit board.

Uses of the phrase "ground" in the foregoing description include at least one of a chassis ground, an Earth ground, a floating ground, a virtual ground, a digital ground, a common ground, or any other form of ground connection applicable to, or suitable for, the teachings of this description. Unless otherwise stated, "about," "approximately," or "substantially" preceding a value means +/−10 percent of the stated value, or, if the value is zero, a reasonable range of values around zero.

Modifications are possible in the described embodiments, and other embodiments are possible, within the scope of the claims.

What is claimed is:

1. An apparatus comprising:
a supply terminal;
a first inductor having a first terminal and a second terminal;

a second inductor having a first terminal and a second terminal, the first terminal of the second inductor coupled to the supply terminal;

a first resistor having a first terminal and a second terminal, the first terminal of the first resistor coupled to the second terminal of the first inductor;

a second resistor having a first terminal and a second terminal, the first terminal of the second resistor coupled to the second terminal of the second inductor;

a first transmission line having a first terminal and a second terminal, the first terminal of the first transmission line coupled to the second terminal of the first resistor;

a second transmission line having a first terminal and a second terminal, the first terminal of the second transmission line coupled to the second terminal of the second resistor;

a first transistor having a first terminal and a control terminal; and a second transistor having a first terminal and a control terminal, the first terminal of the second transistor coupled to the second terminal of the second transmission line and the control terminal of the first transistor, the control terminal of the second transistor coupled to the second terminal of the first transmission line and the first terminal of the first transistor.

2. The apparatus of claim 1, wherein the first transistor further has a second terminal, the second transistor further has a second terminal, and the apparatus further comprising:

a capacitor having a first terminal and a second terminal;

a third resistor having a terminal coupled to the second terminal of the first transistor and the first terminal of the capacitor; and a fourth resistor having a terminal coupled to the second terminal of the second transistor and the second terminal of the capacitor.

3. The apparatus of claim 1, further comprising a capacitor having a first terminal and a second terminal, the first terminal of the capacitor is coupled to the second terminal of the first resistor and the first terminal of the first transmission line, the second terminal of the capacitor coupled to the second terminal of the second resistor and the first terminal of the second transmission line.

4. The apparatus of claim 3, wherein the capacitor further has a third terminal, and the apparatus further comprising:

first peak detector circuitry having a first terminal and a second terminal, the first terminal of the first peak detector circuitry is coupled to the second terminal of the first resistor, the first terminal of the first transmission line, and the first terminal of the capacitor;

second peak detector circuitry having a first terminal and a second terminal, the first terminal of the second peak detector circuitry is coupled to the second terminal of the second resistor, the first terminal of the second transmission line, and the second terminal of the capacitor; and correction circuitry having a first terminal, a second terminal, and a third terminal, the first terminal of the correction circuitry is coupled to the second terminal of the first peak detector circuitry, the second terminal of the correction circuitry is coupled to the second terminal of the second peak detector circuitry, the third terminal of the correction circuitry is coupled to the third terminal of the capacitor.

5. The apparatus of claim 1, wherein the first transmission line includes:

a third inductor having a first terminal and a second terminal;

a capacitor having a terminal coupled to the second terminal of the first resistor and the first terminal of the third inductor; and a third resistor having a first terminal and a second terminal, the first terminal of the third resistor is coupled to the second terminal of the third inductor, the second terminal of the third resistor is coupled to the first terminal of the first transistor and the control terminal of the second transistor.

6. The apparatus of claim 1, wherein the first transmission line and the second transmission line have a length equal to one quarter a wavelength of a frequency of an output signal.

7. The apparatus of claim 1, wherein the first transmission line further has a third terminal, the second transmission line further has a third terminal, and the apparatus further comprising:

phase frequency detector circuitry having an input and an output;

charge pump circuitry having an input and an output, the input of the charge pump circuitry is coupled to the output of the phase frequency detector circuitry;

filter circuitry having an input and an output, the input of the filter circuitry is coupled to the output of the charge pump circuitry, the output of the filter circuitry coupled to the third terminal of the first transmission line and the third terminal of the second transmission line; and frequency divider circuitry having an input and an output, the input of the frequency divider circuitry is coupled to the second terminal of the first transmission line, the first terminal of the first transistor, and the control terminal of the second transistor, the output of the frequency divider circuitry is coupled to the input of the phase frequency detector circuitry.

8. An apparatus comprising:

a supply terminal;

bias network circuitry having a first terminal, a second terminal, and a third terminal, the first terminal of the bias network circuitry coupled to the supply terminal;

a first transmission line having a first terminal and a second terminal;

a second transmission line having a first terminal and a second terminal;

a capacitor having a first terminal and a second terminal, the first terminal of the capacitor coupled to the second terminal of the bias network circuitry and the first terminal of the first transmission line, the second terminal of the capacitor is coupled to the third terminal of the bias network circuitry and the first terminal of the second transmission line;

a first transistor having a first terminal and a control terminal; and a second transistor having a first terminal and a control terminal, the first terminal of the second transistor coupled to the second terminal of the second transmission line and the control terminal of the first transistor, the control terminal of the second transistor coupled to the second terminal of the first transmission line and the first terminal of the first transistor, wherein the bias network circuitry includes:

a first inductor having a first terminal and a second terminal;

a second inductor having a first terminal and a second terminal, the first terminal of the second inductor is coupled to the supply terminal and the first terminal of the first inductor;

a first resistor having a first terminal and a second terminal, the first terminal of the first resistor is coupled to the second terminal of the first inductor, the second terminal of the first resistor is coupled to the first terminal of the first transmission line and the first terminal of the capacitor; and a second resistor having a first terminal and a second terminal, the first terminal of the second resistor is coupled to the second terminal of the second inductor, the second terminal of the second resistor is coupled to the first terminal of the second transmission line and the second terminal of the capacitor.

9. The apparatus of claim 8, wherein the capacitor is a first capacitor, the first transistor further has a second terminal, the second transistor further has a second terminal, and the apparatus further comprising:

a second capacitor having a first terminal and a second terminal;

a third resistor having a terminal coupled to the second terminal of the first transistor and the first terminal of the second capacitor; and a fourth resistor having a terminal coupled to the second terminal of the second transistor and the second terminal of the second capacitor.

10. The apparatus of claim 8, wherein the capacitor further has a third terminal, and the apparatus further comprising:

first peak detector circuitry having a first terminal and a second terminal, the first terminal of the first peak detector circuitry is coupled to the second terminal of the bias network circuitry, the first terminal of the first transmission line, and the first terminal of the capacitor;

second peak detector circuitry having a first terminal and a second terminal, the first terminal of the second peak detector circuitry is coupled to the third terminal of the bias network circuitry, the first terminal of the second transmission line, and the second terminal of the capacitor; and correction circuitry having a first terminal, a second terminal, and a third terminal, the first terminal of the correction circuitry is coupled to the second terminal of the first peak detector circuitry, the second terminal of the correction circuitry is coupled to the second terminal of the second peak detector circuitry, the third terminal of the correction circuitry is coupled to the third terminal of the capacitor.

11. The apparatus of claim 8, wherein the capacitor is a first capacitor, and the first transmission line includes:

an inductor having a first terminal and a second terminal;

a second capacitor having a terminal coupled to the second terminal of the bias network circuitry and the first terminal of the inductor; and a resistor having a first terminal and a second terminal, the first terminal of the resistor is coupled to the second terminal of the inductor, the second terminal of the resistor is coupled to the first terminal of the first transistor and the control terminal of the second transistor.

12. The apparatus of claim 8, wherein the first transmission line and the second transmission line have a length that is one quarter a wavelength of a frequency.

13. The apparatus of claim 8, wherein the first transmission line further has a third terminal, the second transmission line further has a third terminal, and the apparatus further comprising:

phase frequency detector circuitry having an input and an output;

charge pump circuitry having an input and an output, the input of the charge pump circuitry is coupled to the output of the phase frequency detector circuitry;

filter circuitry having an input and an output, the input of the filter circuitry is coupled to the output of the charge pump circuitry, the output of the filter circuitry coupled to the third terminal of the first transmission line and the third terminal of the second transmission line; and frequency divider circuitry having an input and an output, the input of the frequency divider circuitry is coupled to the second terminal of the first transmission line, the first terminal of the first transistor, and the control terminal of the second transistor, the output of the frequency divider circuitry is coupled to the input of the phase frequency detector circuitry.

14. An apparatus comprising:

a supply terminal;

a first inductor coupled to the supply terminal;

a second inductor coupled to the supply terminal;

a first transmission line coupled to the first inductor, the first transmission line having a first resonant frequency, the first transmission line is configured to generate an output signal having a frequency based on the first resonant frequency;

a second transmission line coupled to the second inductor, the second transmission line having a second resonant frequency;

a first transistor coupled to the first transmission line and the second transmission line;

a second transistor coupled to the first transmission line and the second transmission line, the second transistor is configured to control the first transistor based on the second resonant frequency of the second transmission line; and a first resistor coupled to the first inductor and the first transmission line, wherein the resistor is configured to reduce an amplitude of the first resonant frequency of the first transmission line, wherein the first transistor is configured to control the second transistor based on the first resonant frequency of the first transmission line.

15. The apparatus of claim 14, further comprising:

a second resistor coupled to the first transistor; and a capacitor coupled to the first transistor, the second transistor, and the second resistor, the capacitor is configured to reduce a resistance of the first resistor.

16. The apparatus of claim 14, further comprising a capacitor coupled to the first inductor, the second inductor, the first transmission line, and the second transmission line, the capacitor configured to terminate a series resonance of the first transmission line and the second transmission line.

17. The apparatus of claim 16, further comprising voltage sensing circuitry coupled to the first inductor, the second inductor, the first transmission line, the second transmission line, and the capacitor, the voltage sensing circuitry is configured to adjust a capacitance of the capacitor responsive to detecting a voltage peak from one of the first transmission line of the second transmission line.

18. The apparatus of claim 14, wherein the first transmission line and the second transmission line have one of a first length or a second length, the first length is one quarter a first wavelength of a first frequency, the second length is one half a second wavelength of a second frequency.

* * * * *